United States Patent
Ko et al.

(10) Patent No.: US 11,424,172 B2
(45) Date of Patent: Aug. 23, 2022

(54) SEMICONDUCTOR PACKAGE

(71) Applicant: Samsung Electronics Co., Ltd., Suwon-si (KR)

(72) Inventors: Yeongkwon Ko, Hwaseong-si (KR); Seunghun Shin, Cheonan-si (KR); Junyeong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 17/141,290

(22) Filed: Jan. 5, 2021

(65) Prior Publication Data
US 2021/0375709 A1 Dec. 2, 2021

(30) Foreign Application Priority Data
Jun. 1, 2020 (KR) .......................... 10-2020-0066025

(51) Int. Cl.
*H01L 23/31* (2006.01)
*H01L 25/065* (2006.01)
(Continued)

(52) U.S. Cl.
CPC ........ *H01L 23/3128* (2013.01); *H01L 21/561* (2013.01); *H01L 23/481* (2013.01);
(Continued)

(58) Field of Classification Search
CPC . H01L 23/3128; H01L 21/561; H01L 23/481; H01L 25/0652; H01L 25/0657; H01L 25/50; H01L 2225/06541; H01L 21/568; H01L 21/6835; H01L 21/78; H01L 23/3135; H01L 24/16; H01L 24/32;
(Continued)

(56) References Cited

U.S. PATENT DOCUMENTS 8,473,653 B2 6/2013 Kondo et al.
8,513,802 B2 8/2013 Ma et al.
(Continued)

FOREIGN PATENT DOCUMENTS

JP 5567452 B2 8/2014
KR 101624972 B1 5/2016

*Primary Examiner* — Mamadou L Diallo
(74) *Attorney, Agent, or Firm* — Muir Patent Law, PLLC

(57) ABSTRACT

A semiconductor package includes: a first semiconductor chip including a first surface and a second surface opposite to each other and including first through electrodes; at least a second semiconductor chip stacked on the first surface of the first semiconductor chip and comprising second through electrodes electrically connected to the first through electrodes; and a molding layer contacting the first surface of the first semiconductor chip and a side wall of the at least one second semiconductor chip and including a first external side wall connected to and on the same plane as a side wall of the first semiconductor chip, wherein the first external side wall of the molding layer extends to be inclined with respect to a first direction orthogonal to the first surface of the first semiconductor chip, and both the external first side wall of the molding layer and the side wall of the first semiconductor chip have a first slope that is the same for both the first external side wall of the molding layer and the side wall of the first semiconductor chip.

12 Claims, 32 Drawing Sheets

(51) Int. Cl.
  *H01L 23/48* (2006.01)
  *H01L 21/56* (2006.01)
  *H01L 25/00* (2006.01)
(52) U.S. Cl.
  CPC ...... *H01L 25/0652* (2013.01); *H01L 25/0657* (2013.01); *H01L 25/50* (2013.01); *H01L 2225/06541* (2013.01)
(58) Field of Classification Search
  CPC ......... H01L 24/73; H01L 24/81; H01L 24/83; H01L 2221/68327; H01L 2221/68331
  See application file for complete search history.

(56) References Cited

U.S. PATENT DOCUMENTS

| | | | |
|---|---|---|---|
| 9,337,096 B2 | 5/2016 | Wang et al. | |
| 9,355,906 B2 | 5/2016 | Chen et al. | |
| 9,559,005 B2 | 1/2017 | Tsai et al. | |
| 9,711,494 B2 | 7/2017 | England et al. | |
| 9,905,550 B2* | 2/2018 | Han | H01L 25/0657 |
| 10,529,637 B1 | 1/2020 | Yu et al. | |
| 2007/0007639 A1* | 1/2007 | Fukazawa | H01L 25/0657 |
| | | | 438/109 |
| 2009/0091009 A1* | 4/2009 | Corisis | H01L 25/105 |
| | | | 438/109 |
| 2012/0211885 A1* | 8/2012 | Choi | H01L 25/105 |
| | | | 257/737 |
| 2013/0137216 A1* | 5/2013 | Ito | H01L 25/0652 |
| | | | 438/109 |
| 2013/0214427 A1* | 8/2013 | Nakanoya | H01L 23/3135 |
| | | | 257/774 |
| 2013/0273693 A1 | 10/2013 | Haba et al. | |
| 2015/0303075 A1* | 10/2015 | Han | H01L 24/97 |
| | | | 438/113 |
| 2015/0380394 A1* | 12/2015 | Jang | H01L 25/0657 |
| | | | 438/108 |
| 2016/0013174 A1* | 1/2016 | Han | H01L 24/92 |
| | | | 438/109 |
| 2016/0247743 A1* | 8/2016 | Kadoguchi | H01L 23/3675 |
| 2016/0329304 A1 | 11/2016 | Hatakeyama et al. | |
| 2017/0025386 A1* | 1/2017 | Miki | H01L 25/0657 |
| 2017/0154872 A1* | 6/2017 | Moon | H01L 25/0657 |
| 2017/0338206 A1* | 11/2017 | Seo | H01L 25/0657 |
| 2018/0068958 A1* | 3/2018 | Cho | H01L 25/0657 |
| 2020/0058618 A1* | 2/2020 | Hsieh | H01L 24/01 |
| 2021/0111160 A1* | 4/2021 | Kim | H01L 25/18 |
| 2021/0151410 A1* | 5/2021 | Hwang | H01L 25/50 |
| 2021/0210445 A1* | 7/2021 | Cheng | H01L 23/3135 |

* cited by examiner

SEMICONDUCTOR PACKAGE

CROSS-REFERENCE TO RELATED APPLICATION

This application claims the benefit of Korean Patent Application No. 10-2020-0066025, filed on Jun. 1, 2020, in the Korean Intellectual Property Office, the disclosure of which is incorporated herein in its entirety by reference.

BACKGROUND

The inventive concept relates to a semiconductor package.

The demand for the miniaturization, multi-function, and high-performance of electronic products also causes the demand for semiconductor packages that are light in weight, thin, and have high integration, high performance, and high speed. Recently, the demand for a semiconductor package capable of implementing a system having a high memory bandwidth has increased. Because a memory bandwidth is proportional to a data transmission rate and the number of data transmission lines, the memory bandwidth may be increased by increasing a memory operating speed or the number of data transmission lines. To increase the number and density of connection bumps attached to a connection pad of a semiconductor chip, a semiconductor package using an interposer has been introduced. In such a semiconductor package using an interposer, a distance between chips mounted on the interposer has been gradually narrowed to achieve a miniaturized form factor.

SUMMARY

The inventive concept provides a semiconductor package.

According to an aspect of the inventive concept, a semiconductor package includes a first semiconductor chip comprising a first surface and a second surface opposite to each other, at least a second semiconductor chip stacked on the first surface of the first semiconductor chip, and a molding layer contacting the first surface of the first semiconductor chip and a side wall of the second semiconductor chip. The molding layer comprises a first external side wall, comprising a first external side wall portion extending from a lower end of the molding layer adjacent to the first semiconductor chip, to a first height to have a first slope from the lower end of the molding layer to the first height, and a second external side wall portion extending from the first height to a second height to have a second slope from the first height to a second height, the second slope being different from the first slope, wherein the first and second slope are both relative to a horizontal direction parallel to the first surface of the first semiconductor chip.

According to another aspect of the inventive concept, a semiconductor package includes: a first semiconductor chip including a first surface and a second surface opposite to each other and including first through electrodes; at least a second semiconductor chip stacked on the first surface of the first semiconductor chip and comprising second through electrodes electrically connected to the first through electrodes; and a molding layer contacting the first surface of the first semiconductor chip and a side wall of the at least one second semiconductor chip and including a first external side wall connected to and on the same plane as a side wall of the first semiconductor chip, wherein the first external side wall of the molding layer extends to be inclined with respect to a first direction orthogonal to the first surface of the first semiconductor chip, and both the external first side wall of the molding layer and the side wall of the first semiconductor chip have a first slope that is the same for both the first external side wall of the molding layer and the side wall of the first semiconductor chip.

According to another aspect of the inventive concept, a semiconductor package includes: a package board; an interposer on the package board; a first semiconductor device mounted on the interposer; a second semiconductor device mounted on the interposer so as to be spaced apart horizontally from the first semiconductor device and electrically connected to the first semiconductor device through the interposer; and a package molding layer provided on the interposer and covering a side wall of the first semiconductor device and a side wall of the second semiconductor device, wherein the first semiconductor device includes: a first semiconductor chip including a first surface and a second surface opposite to each other; at least one second semiconductor chip mounted on the first semiconductor chip; and a molding layer covering a side wall of the at least one second semiconductor chip, wherein the molding layer includes a first side wall extending to be inclined with respect to a first direction orthogonal to the first surface of the first semiconductor chip, and wherein both the first side wall of the molding layer and the side wall of the first semiconductor chip have a first slope that is the same for both the first side wall of the molding layer and the side wall of the first semiconductor chip.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
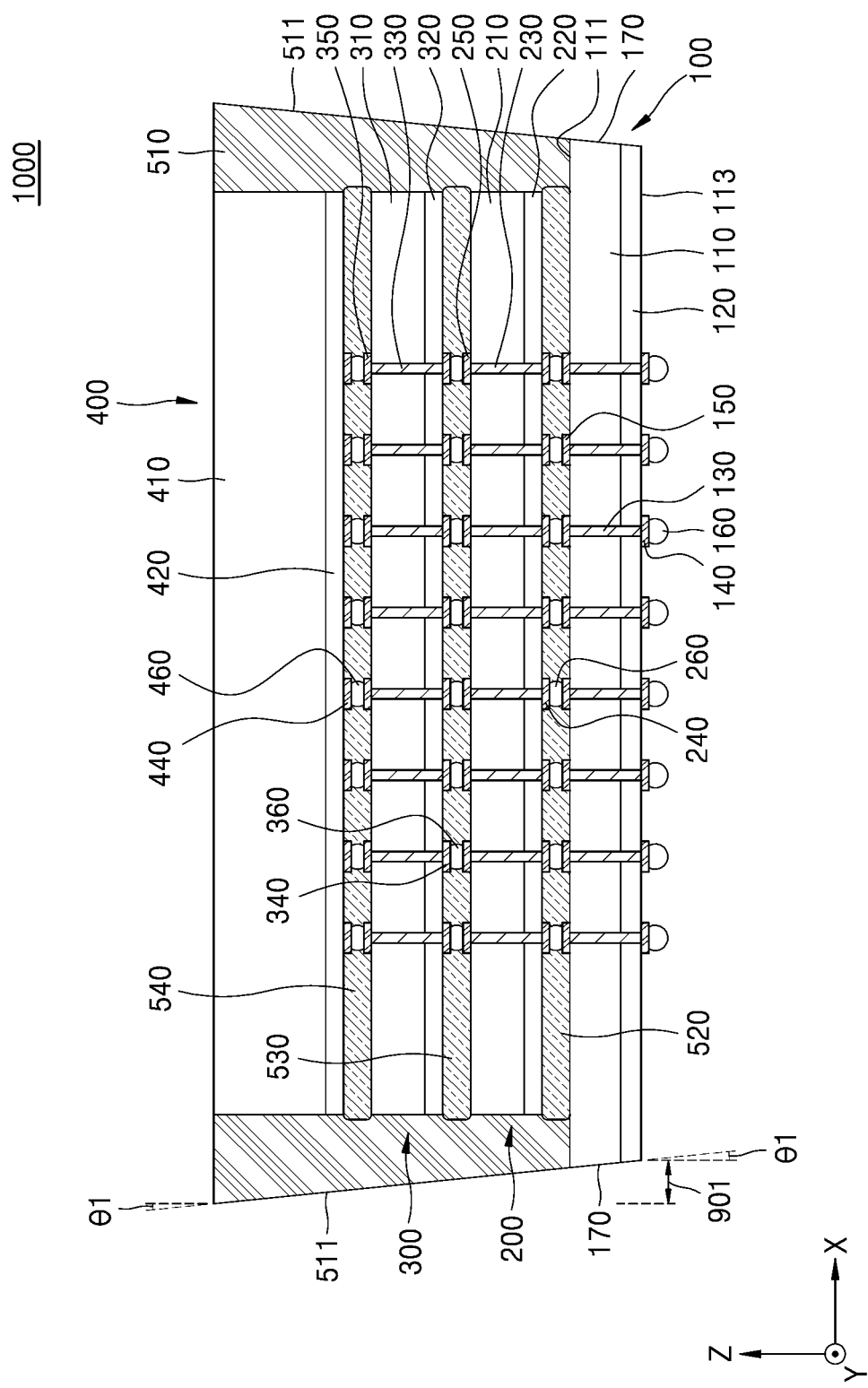
FIG. 1A is a cross-sectional view of a semiconductor package according to example embodiments of the inventive concept.

Hereinafter, embodiments of the inventive concept will be described in detail with reference to the accompanying drawings. Like reference numerals in the drawings denote like elements, and thus their repetitive description will be omitted.

Figure 1B:
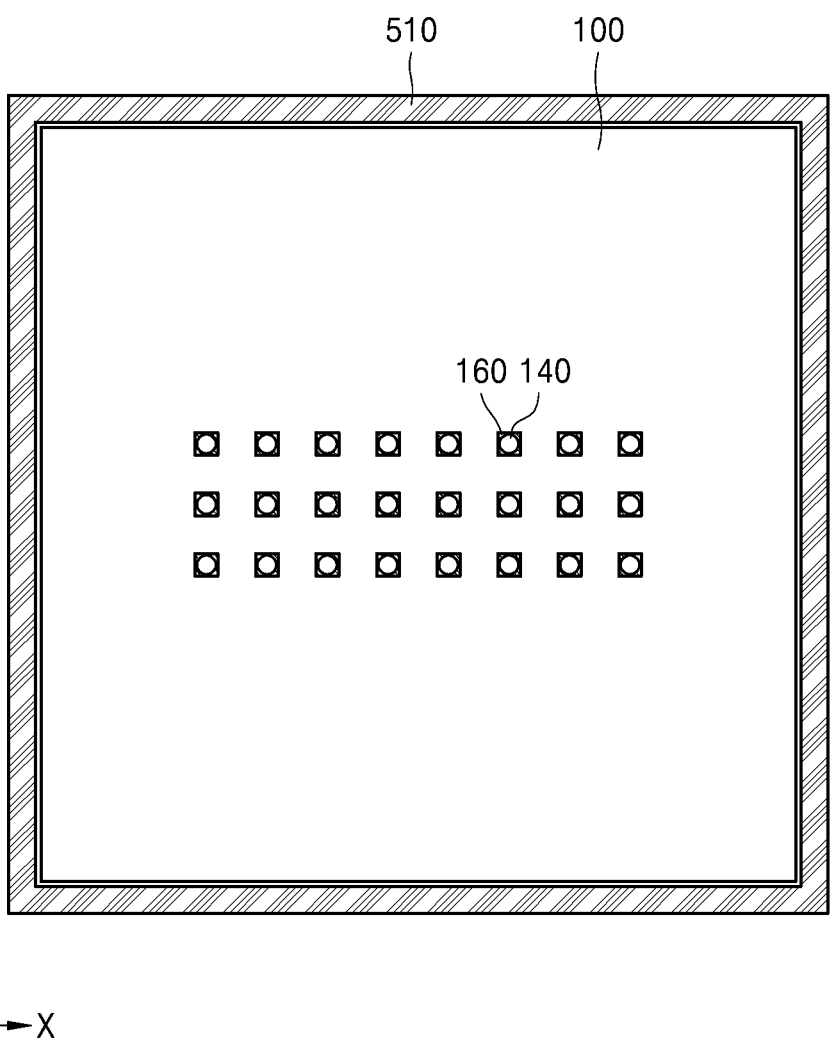
FIG. 1B is a bottom view of the semiconductor package shown in FIG. 1A.

FIG. 1A is a cross-sectional view of a semiconductor package 1000 according to example embodiments of the inventive concept. FIG. 1B is a bottom view of the semiconductor package 1000 shown in FIG. 1A.

Referring to FIG. 1, the semiconductor package 1000 may include a plurality of semiconductor chips stacked in a vertical direction. For example, the semiconductor package 1000 may include a first semiconductor chip 100, a second semiconductor chip 200, a third semiconductor chip 300, and a fourth semiconductor chip 400 stacked in the vertical direction.

For example, a horizontal cross-sectional area of the first semiconductor chip 100 may be greater than each of horizontal cross-sectional areas of the second to fourth semiconductor chips 200, 300, and 400, and the horizontal cross-sectional areas of the second to fourth semiconductor chips 200, 300, and 400 may be substantially the same. As shown in FIG. 1A, the second to fourth semiconductor chips 200, 300, and 400 may be overlaid on the first semiconductor chip 100 in the vertical direction. The second to fourth semiconductor chips 200, 300, and 400 may be vertically aligned so that their edges overlap each other from a plan view.

According to example embodiments of the inventive concept, the first to fourth semiconductor chips 100, 200, 300, and 400 may include the same type of semiconductor chips. For example, the first to fourth semiconductor chips 100, 200, 300, and 400 may be memory semiconductor chips. The memory semiconductor chip may include a volatile memory semiconductor chip, e.g., dynamic random access memory (DRAM) or static random access memory (SRAM) or a nonvolatile memory semiconductor chip, e.g., phase change random access memory (PRAM), magnetoresistive random access memory (MRAM), ferroelectric random access memory (FeRAM), or resistive random access memory (RRAM).

According to example embodiments of the inventive concept, the first to fourth semiconductor chips 100, 200, 300, and 400 may include different types of semiconductor chips. For example, some of the first to fourth semiconductor chips 100, 200, 300, and 400 may include logic chips, and the remaining ones of the first to fourth semiconductor chips 100, 200, 300, and 400 may include memory chips. For example, the logic chip may include a central processing unit (CPU) chip, a graphics processing unit (GPU) chip, or an application processor (AP) chip. Each of the first to fourth semiconductor chips 100, 200, 300, and 400 may be a die formed from a wafer, including an integrated circuit formed thereon. As used herein, the term "semiconductor device" may be used to refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages.

According to example embodiments of the inventive concept, the first to fourth semiconductor chips 100, 200, 300, and 400 may be implemented based on the high bandwidth memory (HBM) or hybrid memory cube (HMC) standard. In this case, the first semiconductor chip 100 in the bottom layer may function as a buffer die, and the second to fourth semiconductor chips 200, 300, and 400 may function as core dies. For example, the buffer die may be referred to as an interface die, a base die, a logic die, a master die, or the like, and the core die may be referred to as a memory die, a slave die, or the like. Although FIG. 1 shows that the semiconductor package 1000 includes three core dies, the number of core dies may be variously changed. For example, the semiconductor package 1000 may include 4, 8, 12, or 16 core dies.

The first semiconductor chip 100 may include a first semiconductor substrate 110, a first semiconductor device layer 120, and first through electrodes 130.

The first semiconductor substrate 110 may include or may be, for example, silicon (Si). Alternatively, the first semiconductor substrate 110 may include or may be a semiconductor element such as germanium (Ge) or a compound semiconductor such as silicon carbide (SiC), gallium arsenide (GaAs), indium arsenide (InAs), or indium phosphide (InP). The first semiconductor substrate 110 may include a conductive region, e.g., an impurity-doped well or an impurity-doped structure. In addition, the first semiconductor substrate 110 may have various device separation structures such as a shallow trench isolation (STI) structure.

The first semiconductor device layer 120 may include various types of a plurality of individual devices and an interlayer insulating layer (not shown). The plurality of individual devices may include various microelectronic devices, e.g., a metal-oxide-semiconductor field effect transistor (MOSFET) such as a complementary metal-oxide-semiconductor (CMOS) transistor, a system large scale integration (LSI) chip, flash memory, DRAM, SRAM, electrically erasable programmable read only memory (EEPROM), PRAM, MRAM, RRAM, an image sensor such as a CMOS imaging sensor (CIS), a micro-electro-mechanical system (MEMS), an active device, a passive device, and the like. The plurality of individual devices may be electrically connected to the conductive region of the first semiconductor substrate 110. The first semiconductor device layer 120 may further include a conductive wiring or a conductive plug electrically connecting at least two of the plurality of individual devices or the plurality of individual devices to the conductive region of the first semiconductor substrate 110.

The first through electrodes 130 may at least partially pass through the first semiconductor substrate 110 and may at least partially further pass through the first semiconductor device layer 120. In some embodiments, the first through electrodes 130 pass fully through the first semiconductor substrate 110 and the first semiconductor device layer 120. The first through electrodes 130 may be configured to electrically connect first upper connection pads 150 on a first surface 111 of the first semiconductor chip 100 to first lower connection pads 140 on a second surface 113, opposite to the first surface 111, of the first semiconductor chip 100, respectively. The first through electrode 130 may include a pillar-shaped buried conductive layer and a cylindrical conductive barrier layer encompassing a side wall of the buried conductive layer. The buried conductive layer may include at least one material selected from among copper (Cu), tungsten (W), nickel (Ni), and cobalt (Co). The conductive barrier layer may include at least one material selected from among titanium (Ti), titanium nitride (TiN), tantalum (Ta), tantalum nitride (TaN), ruthenium (Ru), Co, manganese (Mn), tungsten nitride (WN), Ni, and nickel boron (NiB). A via insulating layer may be between the first semiconductor substrate 110 and the first through electrodes 130. The via insulating layer may include an oxide layer, a nitride layer, a carbide layer, a polymer, or a combination thereof.

The first lower connection pads 140 may be on the second surface 113 of the first semiconductor chip 100. For example, the first lower connection pads 140 may be on the first semiconductor device layer 120 and be electrically connected to the first through electrodes 130, respectively. The first lower connection pad 140 may include or may be at least one of aluminum (Al), Cu, Ni, W, platinum (Pt), and gold (Au).

First connection bumps 160 may be on the first lower connection pads 140, respectively. The first connection bumps 160 may be on the bottom surface of the semiconductor package 1000 and be used to mount the semiconductor package 1000 on an external substrate or interposer. The first connection bumps 160 may be used as an electrical path to receive, from the outside (e.g., outside of the semiconductor package 1000), at least one of a control signal, a power signal, and a ground signal for an operation of the first to fourth semiconductor chips 100, 200, 300, and 400, to receive, from the outside, a data signal to be stored in the first to fourth semiconductor chips 100, 200, 300, and 400, or to provide, to the outside, data stored in the first to fourth semiconductor chips 100, 200, 300, and 400.

The first upper connection pads 150 may be on the first surface 111 of the first semiconductor chip 100. The first upper connection pad 150 may include or may be at least one of Al, Cu, Ni, W, Pt, and Au.

The second semiconductor chip 200 may be mounted on the first surface 111 of the first semiconductor chip 100. The first semiconductor chip 100 may be electrically connected to the second semiconductor chip 200 through second connection bumps 260. A first insulating adhesive layer 520 encompassing and surrounding the second connection bumps 260 may be between the first semiconductor chip 100 and the second semiconductor chip 200. The first insulating adhesive layer 520 may include, for example, a non-conductive film (NCF), a non-conductive paste (NCP), an insulating polymer, or an epoxy resin.

The second semiconductor chip 200 may include a second semiconductor substrate 210, a second semiconductor device layer 220, second through electrodes 230, second upper connection pads 250, and second lower connection pads 240. Because the second semiconductor chip 200 may have the same or similar characteristics as or to those of the first semiconductor chip 100, a detailed description of the second semiconductor chip 200 is omitted herein.

The third semiconductor chip 300 may be mounted on the second semiconductor chip 200 and may include a third semiconductor substrate 310, a third semiconductor device layer 320, third through electrodes 330, third upper connection pads 350, and third lower connection pads 340. The second semiconductor chip 200 may be electrically connected to the third semiconductor chip 300 through third connection bumps 360, and a second insulating adhesive layer 530 encompassing and surrounding the third connection bumps 360 may be between the second semiconductor chip 200 and the third semiconductor chip 300. Because the third semiconductor chip 300 may have similar characteristics to those of the first semiconductor chip 100, a detailed description of the third semiconductor chip 300 is omitted herein.

The fourth semiconductor chip 400 may be mounted on the third semiconductor chip 300 and may include a fourth semiconductor substrate 410, a fourth semiconductor device layer 420, and fourth lower connection pads 440. The third semiconductor chip 300 may be electrically connected to the fourth semiconductor chip 400 through fourth connection bumps 460, and a third insulating adhesive layer 540 encompassing and surrounding the fourth connection bumps 460 may be between the third semiconductor chip 300 and the fourth semiconductor chip 400. Because the fourth semiconductor chip 400 may have similar characteristics to those of the first semiconductor chip 100 except that no through electrodes are included, a detailed description of the fourth semiconductor chip 400 is omitted herein.

The semiconductor package 1000 may include a molding layer 510 in contact with side walls of the second to fourth semiconductor chips 200, 300, and 400 and with the first surface 111 of the first semiconductor chip 100. As described herein, the term "contact" or "in contact with" refers to a direct connection, e.g., touching. The molding layer 510 may cover a portion of the first surface 111 of the first semiconductor chip 100 protruding in a horizontal direction (an X direction and/or a Y direction) from the side wall of the second semiconductor chip 200 and encompass and surround the side walls of the second to fourth semiconductor chips 200, 300, and 400. For example, the molding layer 510 may contact a top surface (e.g., first surface 111) of the first semiconductor chip 100 at an edge area that extends outside the area occupied by the second to fourth semiconductor chips 200, 300, and 400, from a plan view. In addition, the molding layer 510 may cover, and may contact, a side wall of the first insulating adhesive layer 520 protruding in the horizontal direction (the X direction and/or the Y direction) from the side wall of the second semiconductor chip 200, a side wall of the second insulating adhesive layer 530 protruding in the horizontal direction (the X direction and/or the Y direction) from the side wall of the second semiconductor chip 200 and the side wall of the third semiconductor chip 300, and a side wall of the third insulating adhesive layer 540 protruding in the horizontal direction (the X direction and/or the Y direction) from the side wall of the third semiconductor chip 300 and the side wall of the fourth semiconductor chip 400.

According to example embodiments of the inventive concept, the molding layer 510 may include or may be an insulating polymer or an epoxy resin. For example, the molding layer 510 may include an epoxy mold compound (EMC).

The molding layer 510 may include a side wall 511 extending to be inclined with respect to a first direction (e.g., a Z direction) orthogonal to the first surface 111 of the first semiconductor chip 100. Though one side wall 511 is described as an example herein, the molding layer 510 may include, for example, four side walls 511 (e.g., from a plan view the molding layer 510 may have a rectangular, such as a square shape, as shown in FIG. 1B), and though only one sidewall 511 is described in some instances below, a plurality of the sidewalls (e.g., four) may have the structure described in connection with the example sidewall 511 described herein. According to example embodiments of the inventive concept, the side wall 511 of the molding layer 510 may have a profile extending to be inclined outward (e.g., away from a center of the semiconductor package 1000) from a lower end thereof to an upper end thereof. According to example embodiments of the inventive concept, in a second direction (e.g., the X direction or the Y direction) that is parallel to the first surface 111 of the first semiconductor chip 100, a width of an upper surface of the molding layer 510 in the second direction (e.g., the X direction or the Y direction) may be greater than a width of a lower surface of the molding layer 510 in the second direction (e.g., the X direction or the Y direction). According to example embodiments of the inventive concept, a width of the molding layer 510 in the second direction (e.g., the X direction or the Y direction) may increase away from the first semiconductor chip 100 (e.g., away from the semiconductor chip of the package that includes external connection terminals for communicating outside of the semiconductor package). For example, as shown in FIG. 1A, a cross-section of the molding layer 510 cut in the vertical direction may have an inverted trapezoidal shape, also described as a trapezoidal shape with a longer top surface than bottom surface. According to the shape depicted in FIG. 1A, when the semiconductor package 1000 is oriented so that the first chip 100 is the bottom, and the fourth semiconductor chip 400 is the top, one or more side walls 511 of the molding layer 510 may have an overhanging slope, and opposite side walls 511 may be tapered such that they get closer together in a direction from a top to bottom of the semiconductor package 1000.

The first semiconductor chip 100 may include a side wall 170 extending to be inclined with respect to the first direction (e.g., the Z direction). The first semiconductor chip 100 may include, for example, four such side walls 170, and though only one side wall 170 is described in some instances below, a plurality of the side walls (e.g., four) may have the structure described in connection with the example side wall 170 described herein. According to example embodiments of the inventive concept, the side wall 170 of the first semiconductor chip 100 may have a profile extending to be inclined outward from a lower end thereof to an upper end thereof, and may be tapered in a similar manner as the side wall 511 of the molding layer 510.

The side wall 170 of the first semiconductor chip 100 may be connected to the side wall 511 of the molding layer 510. According to example embodiments of the inventive concept, the side wall 511 of the molding layer 510 and the side wall 170 of the first semiconductor chip 100 may form a whole, continuous, side wall of the semiconductor package 1000. The semiconductor package 1000 may have four total sidewalls, each having the configuration of the example side walls 511 and 170 described above. According to example embodiments of the inventive concept, the side wall 511 of the molding layer 510 and the side wall 170 of the first semiconductor chip 100 for each sidewall of the semiconductor package 1000 may have the same slope and be on the same plane.

According to example embodiments of the inventive concept, the side wall 511 of the molding layer 510 and the side wall 170 of the first semiconductor chip 100 may extend to be inclined at the same first angle θ1 of inclination with respect to the first direction (e.g., the Z direction), or with respect to a direction perpendicular to the first direction (e.g., the angle of inclination may be measured respective to a horizontal direction parallel to a top surface of the first semiconductor chip 100). According to example embodiments of the inventive concept, the first angle θ1 of inclination may be about 0.5 degrees (°) to about 5°. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Because the side wall 511 of the molding layer 510 and the side wall 170 of the first semiconductor chip 100, which form the side wall of the semiconductor package 1000, extend to be inclined with respect to the first direction (e.g., the Z direction), the side wall of the semiconductor package 1000 may also extend to be inclined with a constant slope with respect to the first direction (e.g., the Z direction). The side walls 511 of the molding layer 510, the side wall 170 of the first semiconductor chip 100, and the side wall of the semiconductor package 1000, and similar sidewalls in later embodiments, may be described as external sidewalls, which are exposed to the outside of the semiconductor package 1000. For example, the side wall of the semiconductor package 1000 may have a profile having the constant slope and extending to be inclined outward from a lower end thereof to an upper end thereof (e.g., to have an overhanging slope). For example, a width of the semiconductor package 1000 in the second direction (e.g., the X direction or the Y direction) may gradually increase from a lower part to an upper part thereof, and a cross-section of the semiconductor package 1000 cut in the vertical direction may have an inverted trapezoidal shape. In this manner, the sidewalls of the semiconductor package 1000 may be tapered such that they get closer together in a direction from a top to bottom of the semiconductor package 1000.

As shown in FIG. 1, when the semiconductor package 1000 has a vertical cross-section of an inverted trapezoidal shape, the upper end of the side wall of the semiconductor package 1000 may protrude further outward than the lower end of the side wall of the semiconductor package 1000. According to example embodiments of the inventive concept, a distance 901 between the upper end of the side wall of the semiconductor package 1000 and the lower end of the side wall of the semiconductor package 1000 in the second direction (e.g., the X direction or the Y direction) may be about 0.1 micrometers (μμm) to about 10 μm.

FIGS. 2A to 2K are cross-sectional views to describe a method of manufacturing a semiconductor package, according to example embodiments of the inventive concept. Hereinafter, a method of manufacturing the semiconductor package 1000 shown in FIGS. 1A and 1B will be described with reference to FIGS. 2A to 2K.

Figure 2A:
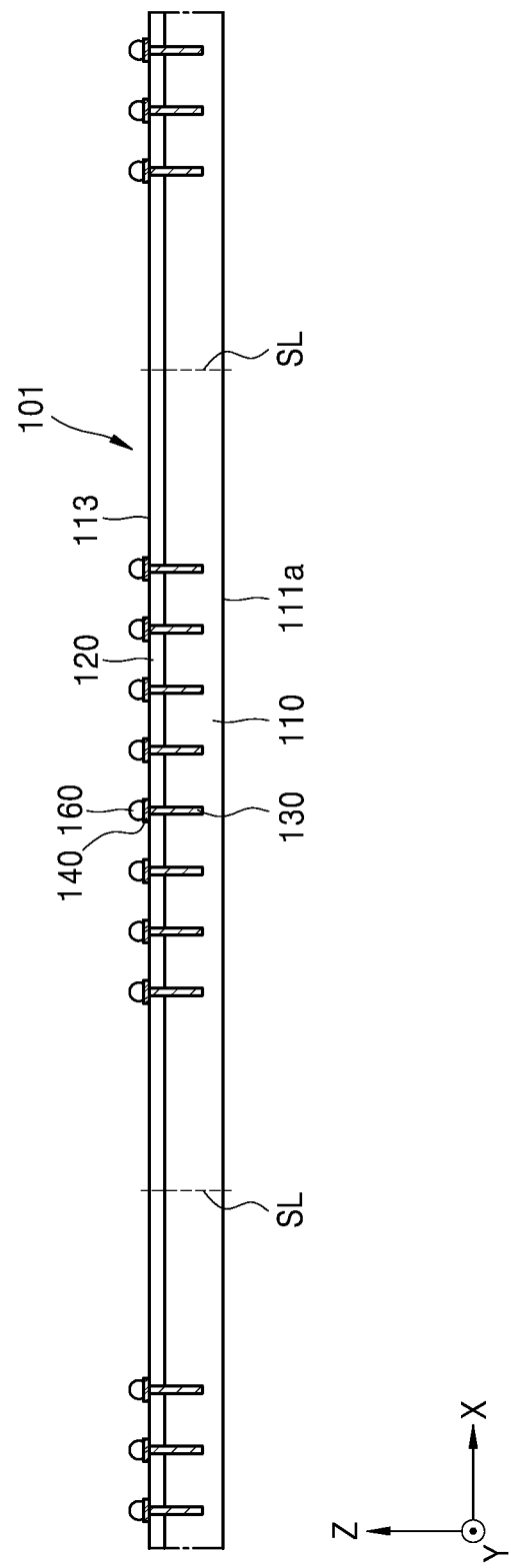
FIGS. 2A to 2K are cross-sectional views to describe a method of manufacturing a semiconductor package, according to example embodiments of the inventive concept.

Referring to FIG. 2A, a first semiconductor wafer 101 is prepared. The first semiconductor wafer 101 may include a plurality of semiconductor devices divided by a scribe lane SL. A semiconductor device includes the first semiconductor wafer 101 including a frontside surface and a backside surface opposite to each other, the first semiconductor device layer 120 on the frontside surface of the first semiconductor wafer 101, and the first through electrodes 130. The first lower connection pads 140 respectively, electrically connected to the first through electrodes 130 are formed on the frontside surface of the first semiconductor wafer 101, and the first connection bumps 160 are respectively formed on the first lower connection pads 140.

Figure 2B:
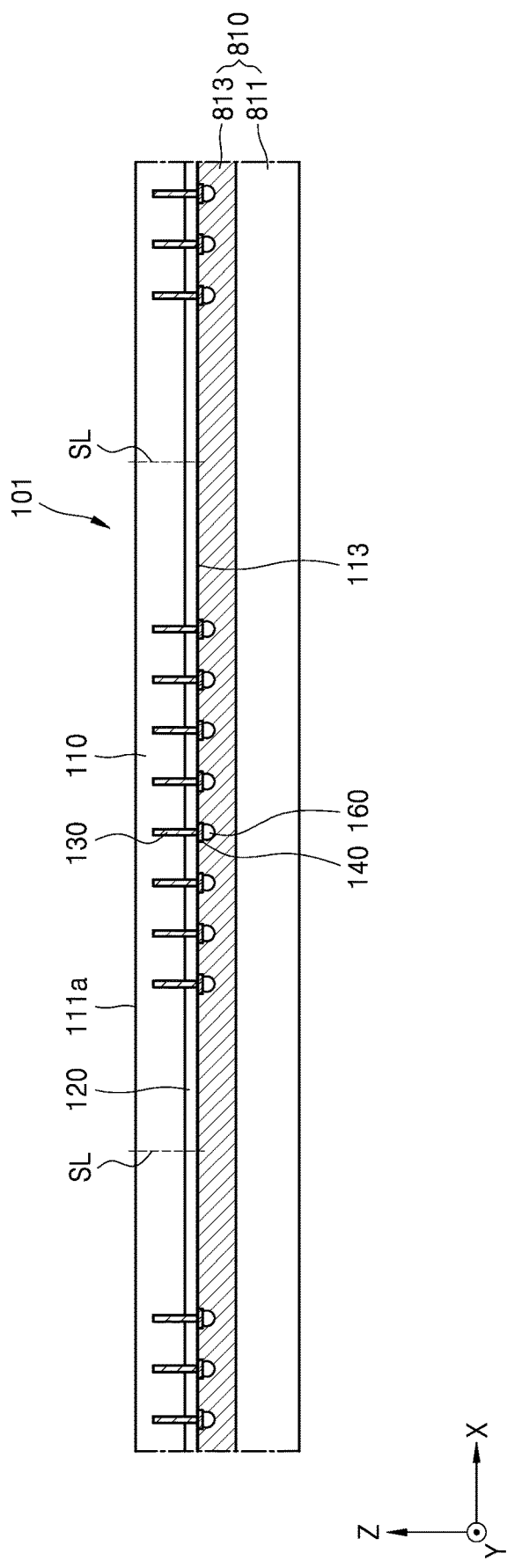

Referring to FIG. 2B, the first semiconductor wafer 101 having the first connection bumps 160 formed thereon is attached on a first carrier substrate 810. The first carrier substrate 810 may include a support substrate 811 and an adhesive material 813 on the support substrate 811. The second surface 113 of the first semiconductor wafer 101 may come in contact with the first carrier substrate 810, and a first surface 111a of the first semiconductor wafer 101 may be exposed upward.

Figure 2C:
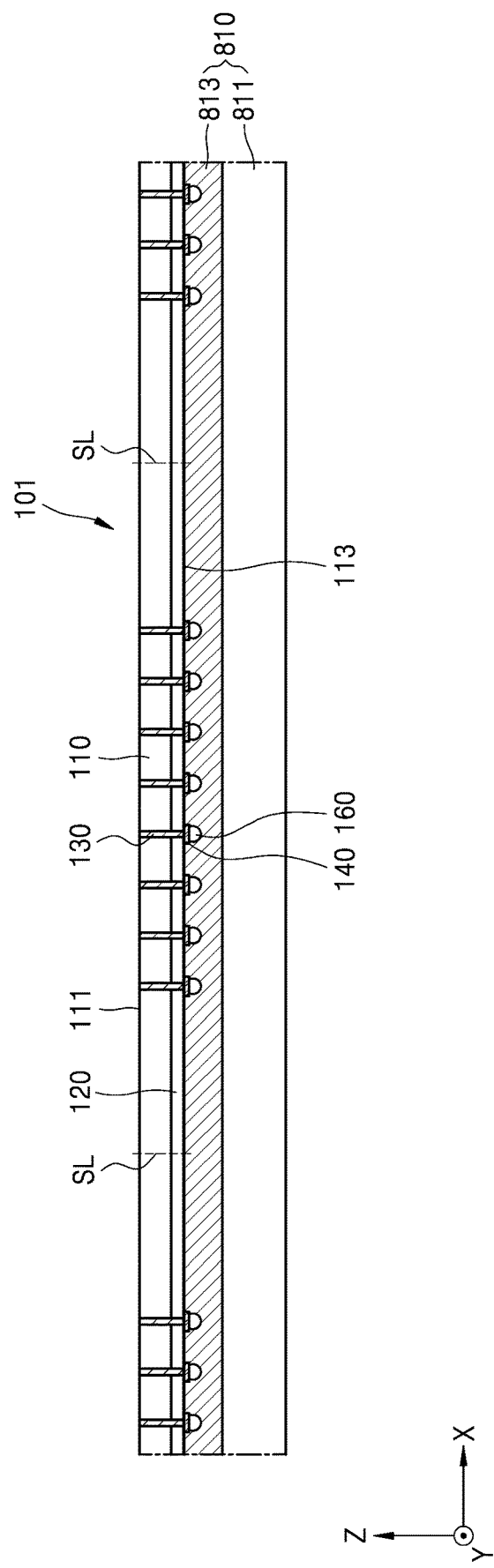

Referring to FIG. 2C, a portion of the first through electrodes 130 may be exposed by removing a portion of the first semiconductor wafer 101. As a result of removing the portion of the first semiconductor wafer 101, the first through electrodes 130 may have a shape passing through the first semiconductor wafer 101. For example, to expose the first through electrodes 130, the portion of the first semiconductor wafer 101 may be removed using a chemical mechanical polishing (CMP) process, an etch-back process, or a combination thereof.

Figure 2D:
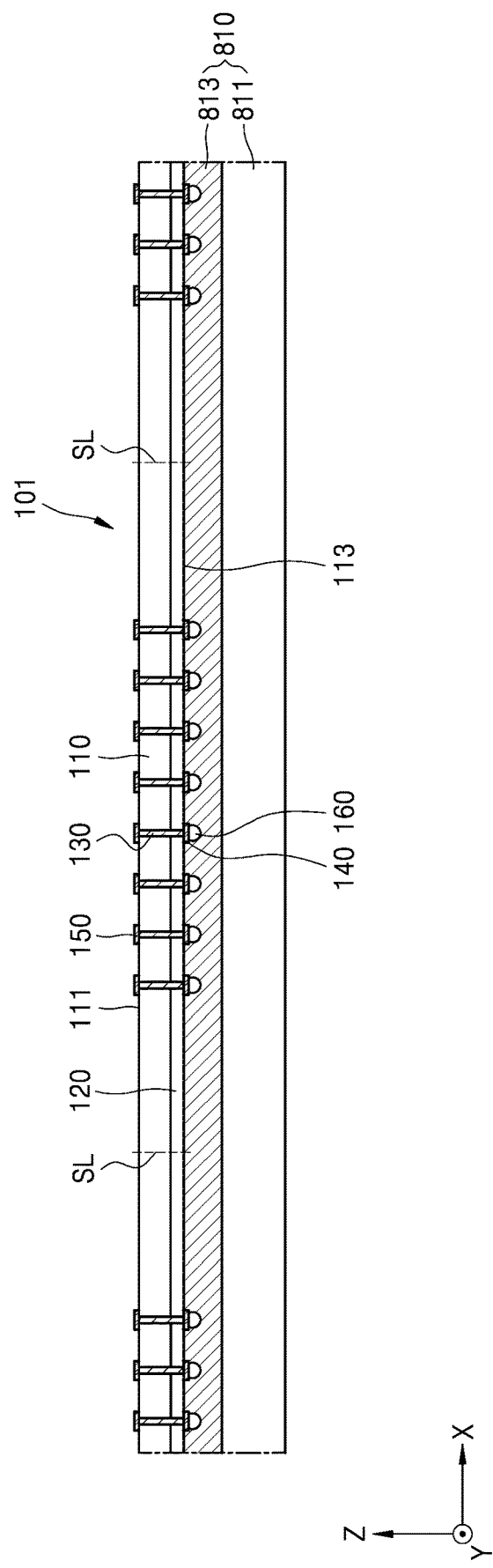

Referring to FIG. 2D, the first upper connection pads 150 respectively, electrically connected to the first through electrodes 130 are formed on the first surface 111 of the first semiconductor wafer 101.

Figure 2E:
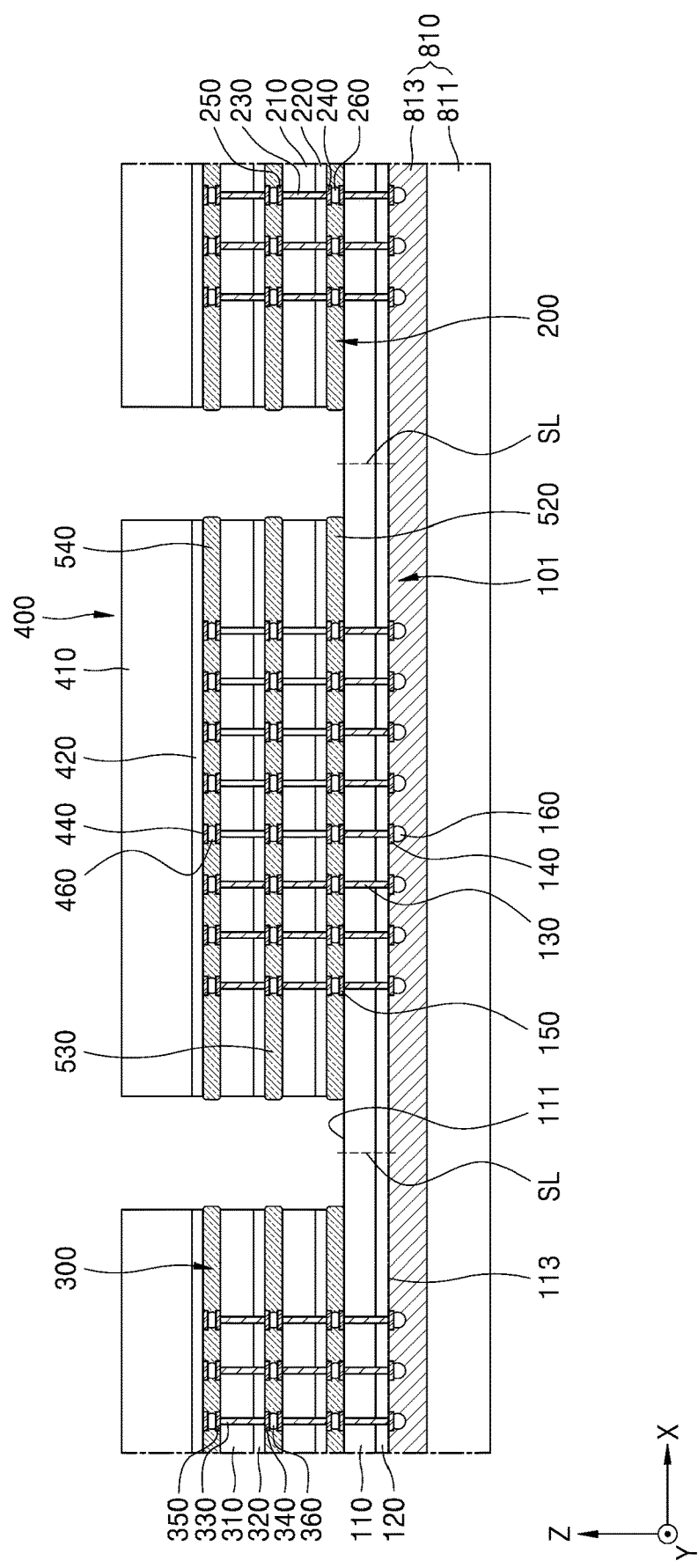

Referring to FIG. 2E, second semiconductor chips 200 are stacked on the first surface 111 of the first semiconductor wafer 101. The second semiconductor chips 200 may be apart from each other in the horizontal direction on the first surface 111 of the first semiconductor wafer 101. The second semiconductor chips 200 may be manufactured by, for example, processing a semiconductor wafer in a process similar to FIGS. 2A to 2D and cutting the processed semiconductor wafer into individual chips.

Each second semiconductor chip 200 may be stacked on the first semiconductor wafer 101 such that the first through electrodes 130 are respectively, electrically connected to the second through electrodes 230. To respectively, electrically connect the first through electrodes 130 to the second through electrodes 230, each second semiconductor chip 200 may be stacked on the first semiconductor wafer 101 such that the second connection bumps 260 of the second semiconductor chip 200 respectively come in contact with the first upper connection pads 150. The first insulating adhesive layer 520 may be formed between the first semiconductor wafer 101 and each second semiconductor chip 200. The first insulating adhesive layer 520 may be formed between the first semiconductor wafer 101 and each second semiconductor chip 200 to encompass and surround and cover the second connection bumps 260. The first insulating adhesive layer 520 may include, for example, an NCF.

For example, a reflow process or a thermal compression process may be performed to stack the second semiconductor chips 200 on the first semiconductor wafer 101. Through the reflow process or the thermal compression process, an adhesive force between the second connection bumps 260 and the first upper connection pads 150 may be improved, and an adhesive force between the second connection bumps 260 and the second lower connection pads 240 may be improved.

After stacking the second semiconductor chips 200 on the first semiconductor wafer 101, by a method similar to the stacking method of the second semiconductor chips 200, third semiconductor chips 300 may be stacked on the second semiconductor chips 200, and fourth semiconductor chips 400 may be stacked on the third semiconductor chips 300.

Figure 2F:
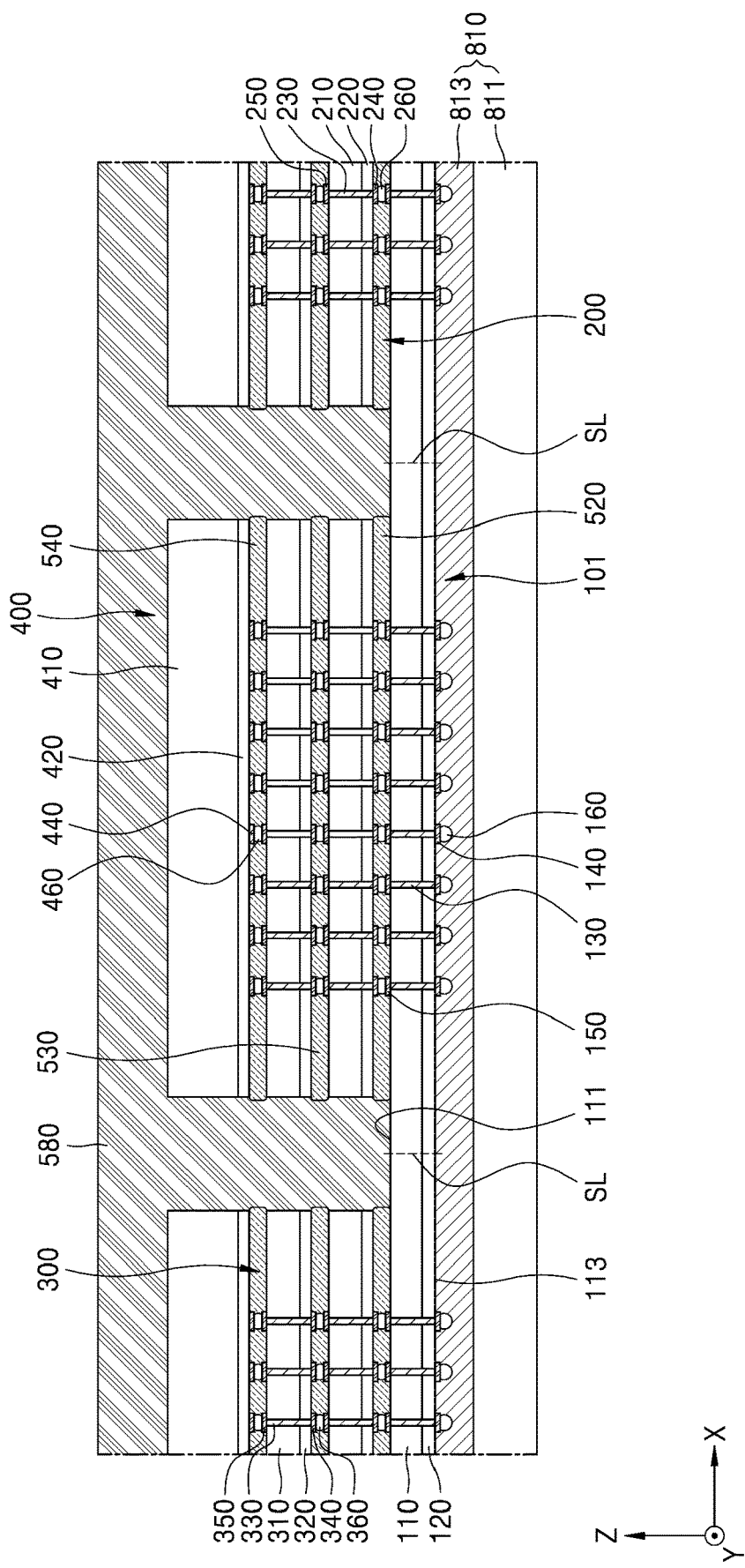

Referring to FIG. 2F, a preliminary molding layer 580 molding the second to fourth semiconductor chips 200, 300, and 400 is formed on the first semiconductor wafer 101. To form the preliminary molding layer 580, an appropriate amount of molding material may be supplied onto the first semiconductor wafer 101, and the molding material may be cured by a curing process.

Figure 2G:
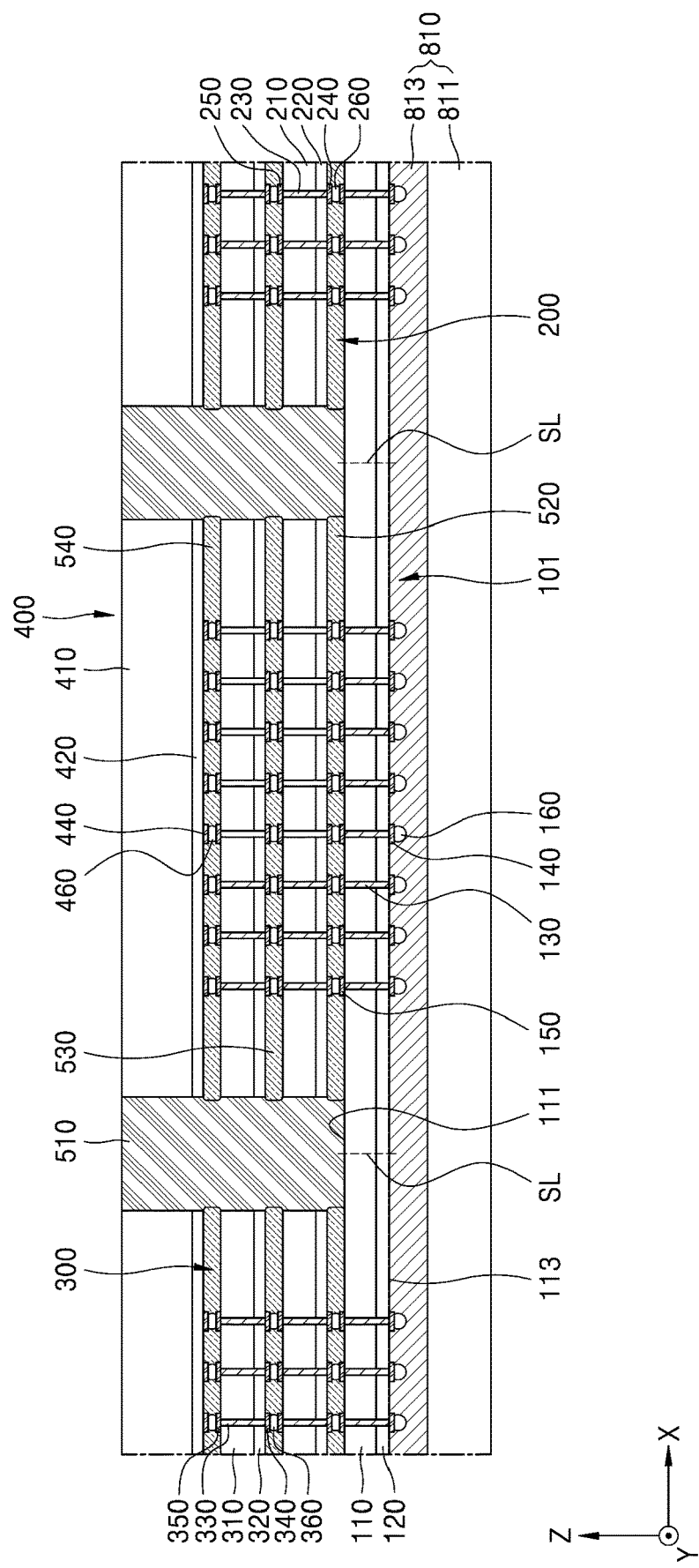

Referring to FIGS. 2F and 2G, a portion of the preliminary molding layer 580 may be removed by a planarization process such as CMP so that an upper surface of the fourth semiconductor chips 400 is exposed. By the planarization process, a portion of the fourth semiconductor chips 400 may be removed together with the portion of the preliminary molding layer 580. As a result of removing the portion of the preliminary molding layer 580, the molding layer 510 covering an upper surface of the first semiconductor wafer 101 and the side walls of the second to fourth semiconductor chips 200, 300, and 400, and exposing the upper surface of the fourth semiconductor chips 400 may be formed.

Referring to 2H, a second carrier substrate 820 may be attached on an upper surface of the planarized molding layer 510 and the upper surface of the fourth semiconductor chip 400. For example, the second carrier substrate 820 may include a dicing film.

Figure 2H:
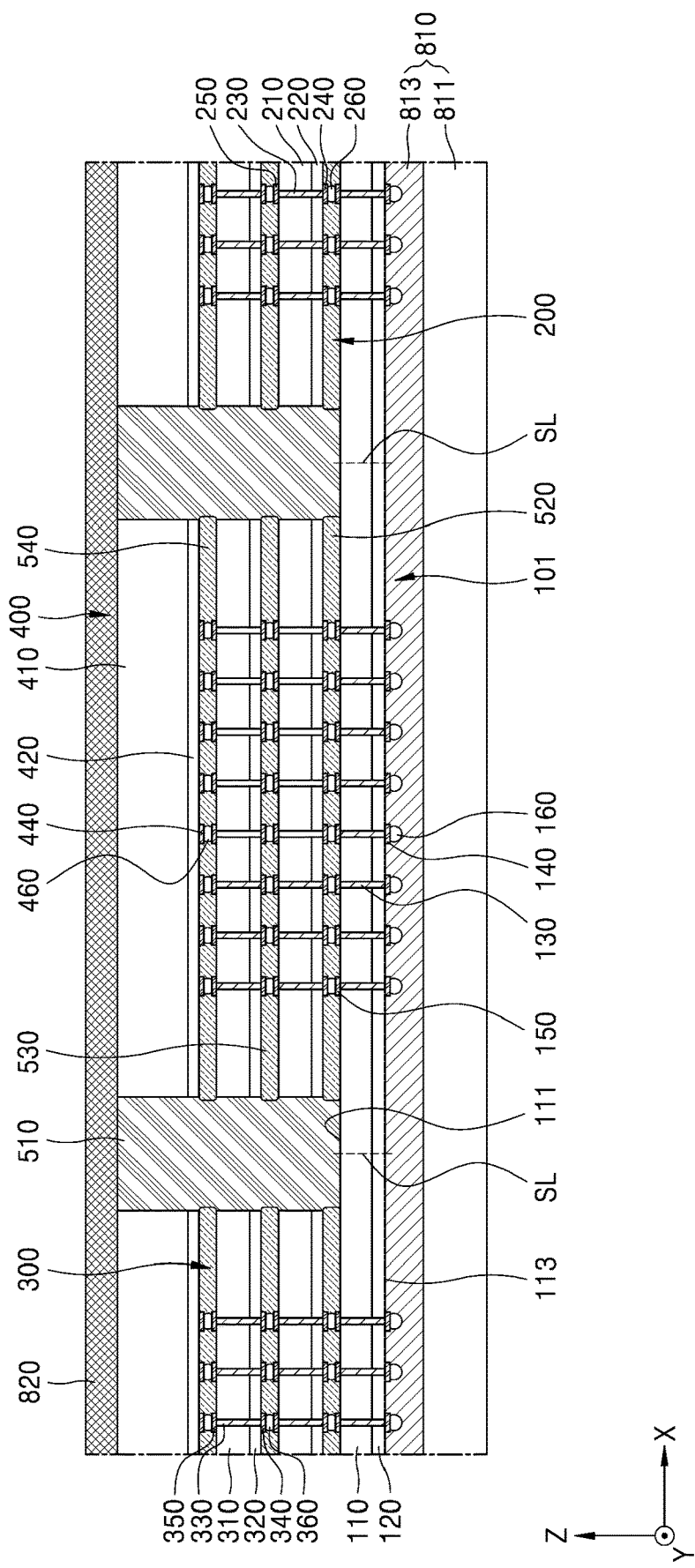

Referring to 2I, a result of FIG. 2H (e.g., the resulting structure) is turned over, and then, the first carrier substrate 810 is removed. The second surface 113 of the first semiconductor wafer 101 may be exposed by removing the first carrier substrate 810.

Figure 2I:
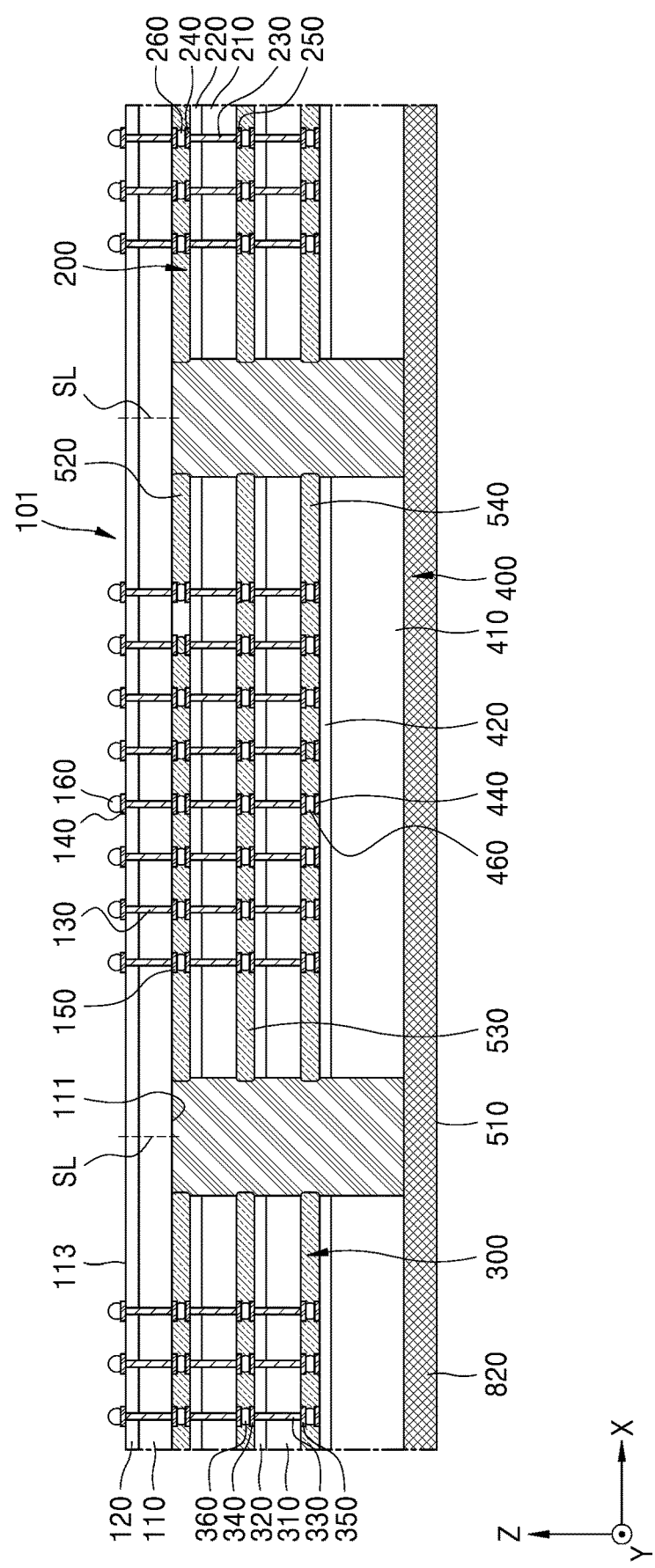
Figure 2J:
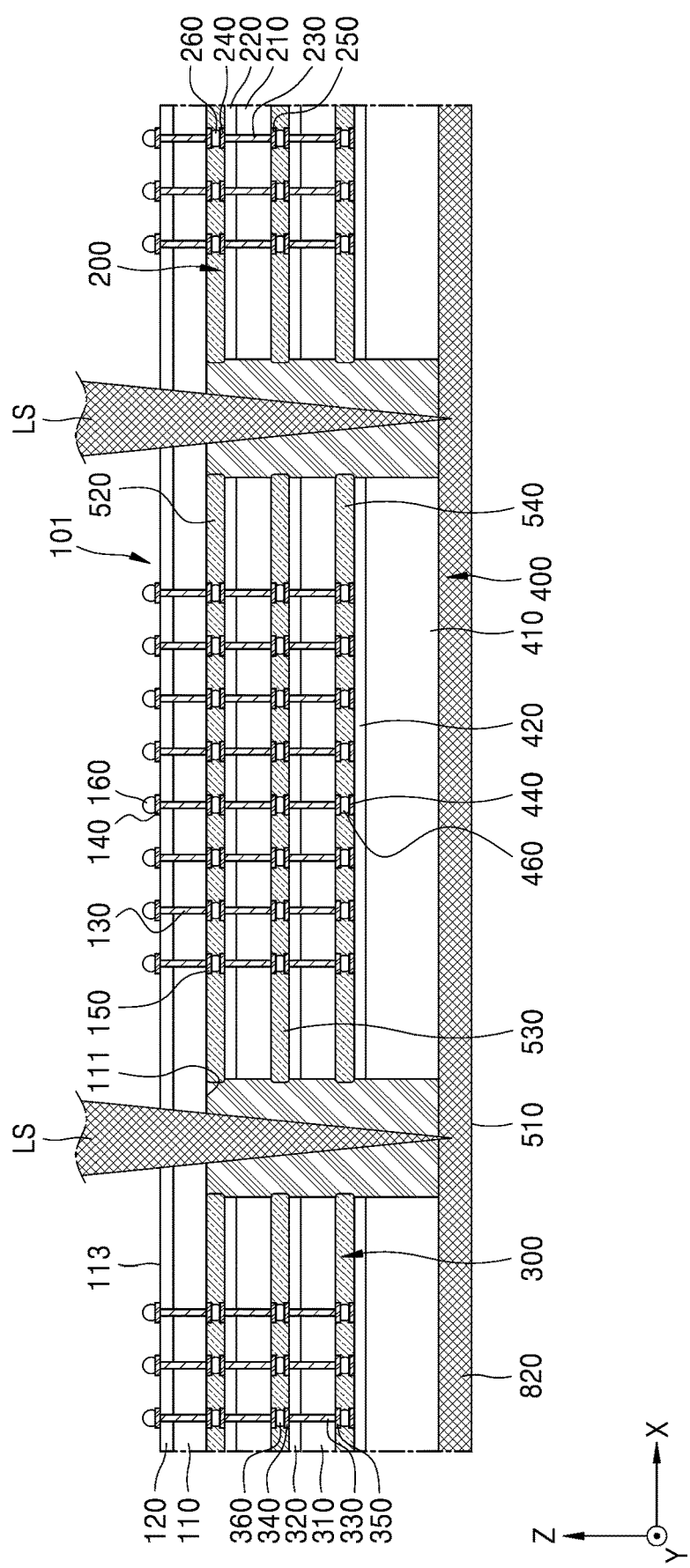
Figure 2K:
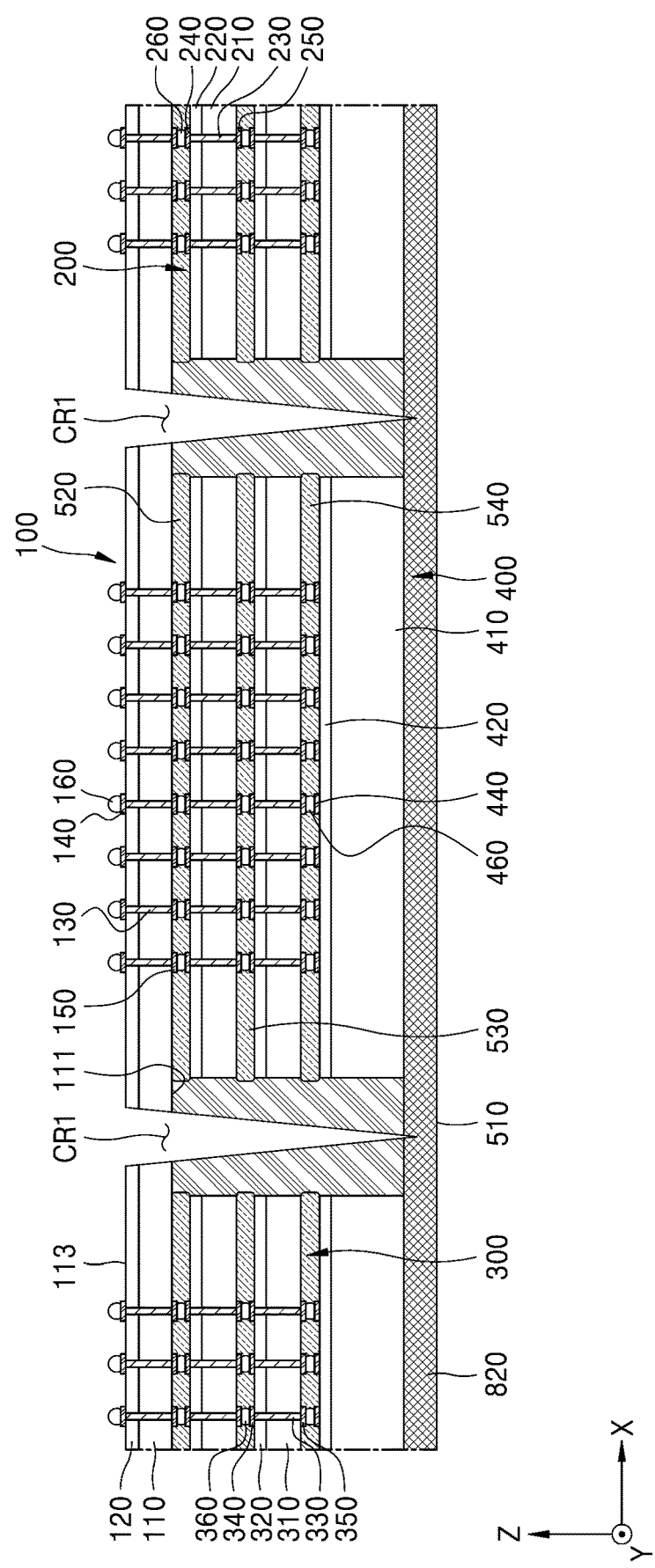

Referring to FIGS. 2J and 2K, a sawing process of cutting a result of FIG. 2I along scribe lanes SL of the first semiconductor wafer 101 is performed. By the sawing process, the result of FIG. 2I may be divided into semiconductor packages 1000 each including the first to fourth semiconductor chips 100, 200, 300, and 400 as shown in FIG. 1A. After obtaining the divided semiconductor packages 1000 by the sawing process, the second carrier substrate 820 may be removed.

According to example embodiments of the inventive concept, the sawing process may include a laser cutting process of cutting an object to be cut, by using a laser beam LS generated by a laser irradiation apparatus. By the laser cutting process, the result of FIG. 2I may be cut from the second surface 113 of the first semiconductor wafer 101 to a bottom surface of the molding layer 510 in contact with the second carrier substrate 820 along the scribe lanes SL of the first semiconductor wafer 101 by using the laser beam LS.

The laser cutting process may form a cut region CR1 in a shape of which a width is gradually narrowed along an irradiation direction of the laser beam LS. For example, the cut region CR1 may have a tapered shape of which a width is gradually narrowed downward in a direction from the first semiconductor wafer 101 toward the fourth semiconductor chip 400. Accordingly, the side wall of the semiconductor package 1000 divided by the laser cutting process may have inclination. As a result of cutting the result of FIG. 2I by using the laser cutting process once (e.g., a single cutting step to form the cut region CR1), the side wall of the semiconductor package 1000 may have a constant slope.

Because highly precise processing is possible in the laser cutting process, the semiconductor package 1000 having a uniform dimension may be manufactured. In addition, because an object to be cut may be cut with a narrow kerf width in the laser cutting process, productivity may be improved.

Figure 3:
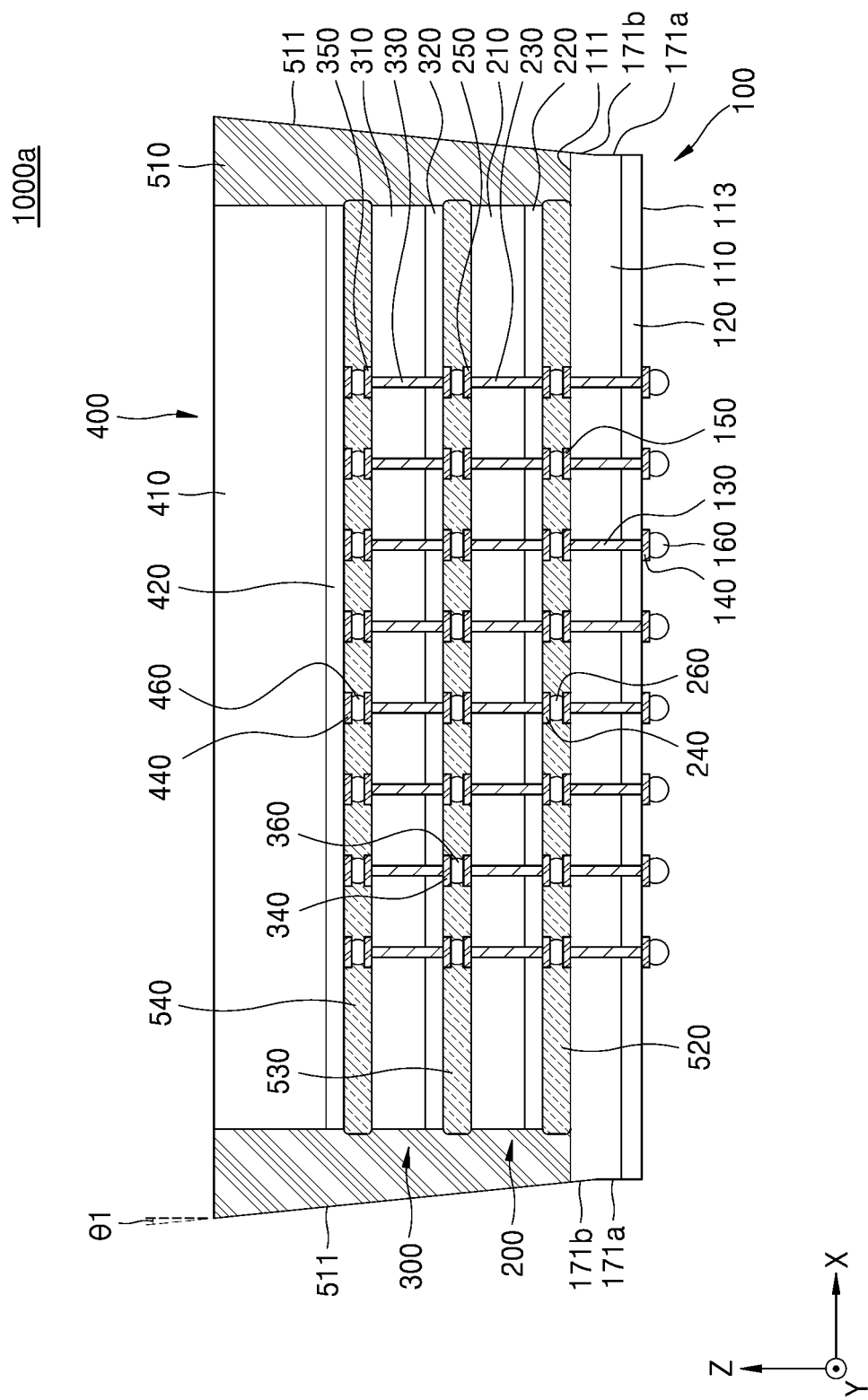
FIG. 3 is a cross-sectional view of a semiconductor package according to example embodiments of the inventive concept.

FIG. 3 is a cross-sectional view of a semiconductor package 1000a according to example embodiments of the inventive concept. The semiconductor package 1000a shown in FIG. 3 may be substantially the same as or similar to the semiconductor package 1000 shown in FIGS. 1A and 1B except for a shape of a side wall. Hereinafter, a difference from the semiconductor package 1000 shown in FIGS. 1A and 1B will be mainly described.

Referring to FIG. 3, a side wall (e.g., each sidewall) of the first semiconductor chip 100 may include a lower part 171a and an upper part 171b having different slopes. For example, the lower part 171a of the side wall of the first semiconductor chip 100 may have a profile extending substantially in parallel to the first direction (e.g., the Z direction) orthogonal to the first surface 111 of the first semiconductor chip 100, and the upper part 171b of the side wall of the first semiconductor chip 100 may have a profile extending to be inclined outward from a lower end thereof to an upper end thereof. Terms such as "same," "equal," "planar," or "coplanar," as used herein encompass identically or near identically including variations that may occur, for example, due to manufacturing processes. The term "substantially" may be used herein to emphasize this meaning, unless the context or other statements indicate otherwise.

According to example embodiments of the inventive concept, the upper part 171b of the side wall of the first semiconductor chip 100 may be connected to the side wall 511 of the molding layer 510, and the upper part 171b of the side wall of the first semiconductor chip 100 and the side wall 511 of the molding layer 510 may have the same slope. According to example embodiments of the inventive concept, the upper part 171b of the side wall of the first semiconductor chip 100 and the side wall 511 of the molding layer 510 may extend to be inclined at the same first angle θ1 of inclination with respect to the first direction (e.g., the Z direction) orthogonal to the first surface 111 of the first semiconductor chip 100, and may be on the same plane.

According to example embodiments of the inventive concept, the side wall of the first semiconductor chip 100 and the side wall 511 of the molding layer 510 may form a side wall of the semiconductor package 1000a. In this case, a profile of the semiconductor package 1000a may include a combination of two straight lines having different slopes. For example, a side wall lower part and a side wall upper part of the semiconductor package 1000a may extend with different slopes (e.g., with one slope being vertical and the other slope being inclined).

According to other example embodiments of the inventive concept, unlike shown in FIG. 3, a side wall of the molding layer 510 may include a lower part and an upper part having different slopes, and the whole side wall of the first semiconductor chip 100 may have the same slope as the lower part of the side wall of the molding layer 510. For example, the lower part of the side wall of the molding layer 510 and the side wall of the first semiconductor chip 100 may extend substantially in parallel to the first direction (e.g., the Z direction), and the upper part of the side wall of the molding layer 510 may extend in a direction inclined with respect to the first direction (e.g., the Z direction).

Figure 4A:
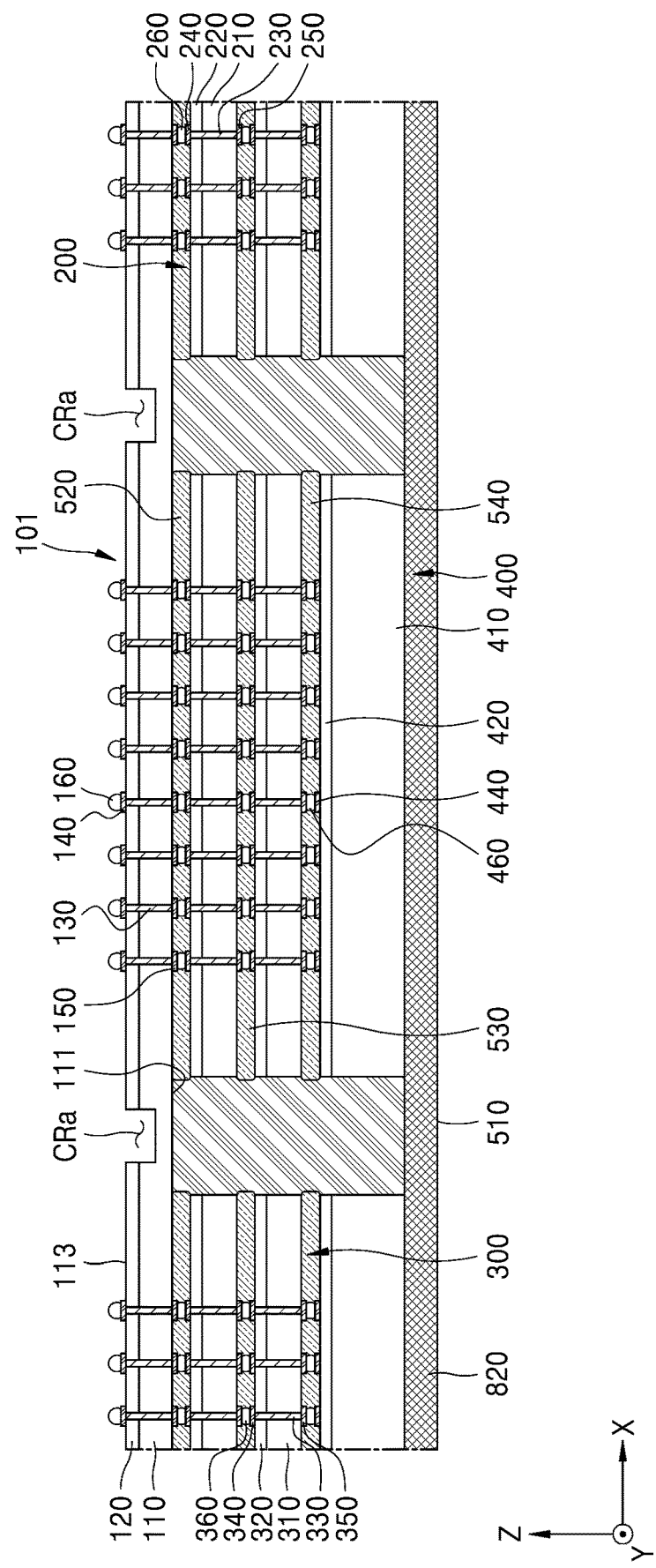
FIGS. 4A and 4B are cross-sectional views to describe a method of manufacturing a semiconductor package, according to example embodiments of the inventive concept.
Figure 4B:
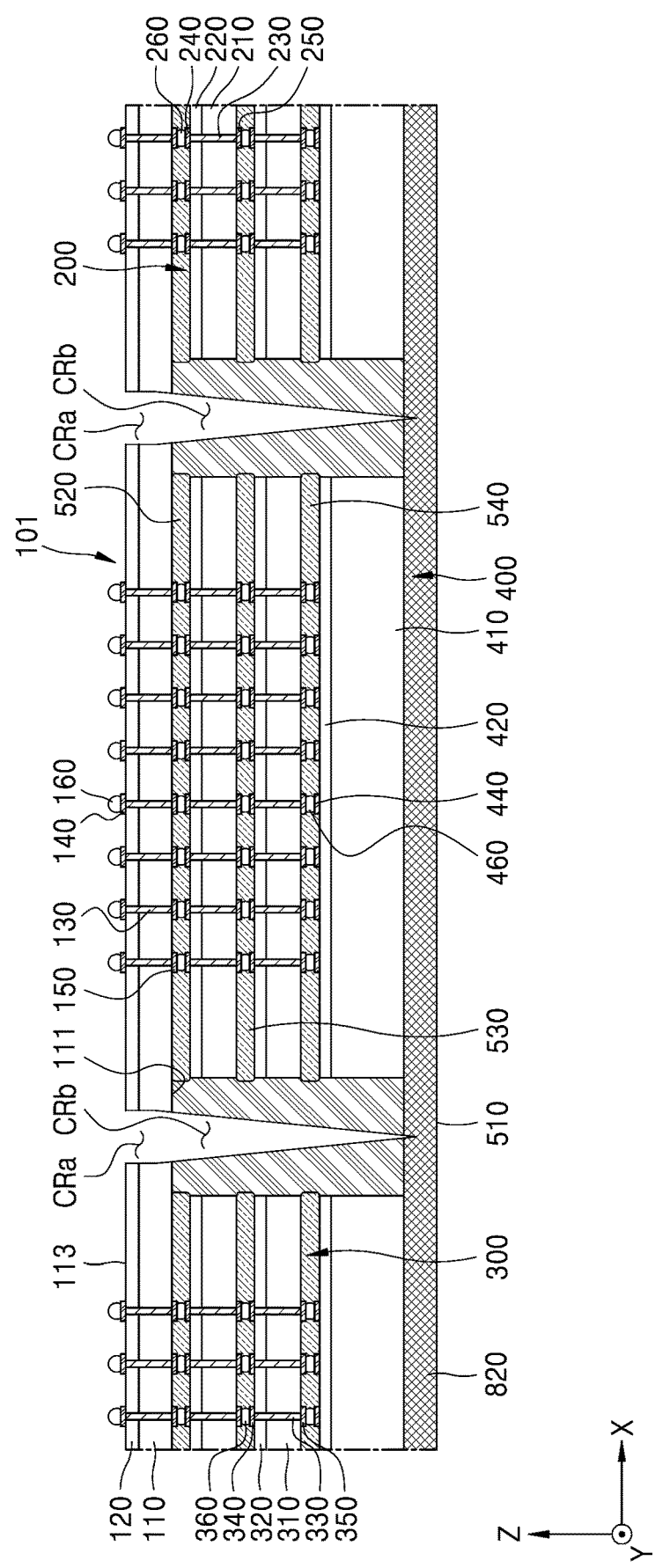

FIGS. 4A and 4B are cross-sectional views to describe a method of manufacturing a semiconductor package, according to example embodiments of the inventive concept. Hereinafter, a method of manufacturing the semiconductor package 1000a shown in FIG. 3 will be described with reference to FIGS. 4A and 4B mainly based on a difference from the semiconductor package manufacturing method described with reference to FIGS. 2A to 2K.

Referring to both FIGS. 4A and 2I, a structure corresponding to the result of FIG. 2I is prepared, and a primary sub-sawing process on the structure is performed. The primary sub-sawing process may partially cut the structure from the second surface 113 of the first semiconductor wafer 101 along the scribe lane SL of the first semiconductor wafer 101. For example, a primary sub-cut region CRa formed by the primary sub-sawing process extends downward from the second surface 113 of the first semiconductor wafer 101 but does not pass through the structure.

According to example embodiments of the inventive concept, the primary sub-sawing process may differ from a laser cutting process. The primary sub-cut region CRa formed by the primary sub-sawing process may be formed to extend downward with a substantially uniform width. For example, the primary sub-sawing process may be a blade cutting process of cutting an object to be cut, by using a sawing blade. A side wall part of the semiconductor package 1000a formed by being cut by the blade cutting process may have a different profile from a cut surface formed by a laser cutting process. For example, it may have a profile extending in the vertical direction.

Referring to FIG. 4B, a secondary sub-sawing process on a result of FIG. 4A is performed. In the secondary sub-sawing process, the result of FIG. 4A may be cut from the bottom of the primary sub-cut region CRa formed by the primary sub-sawing process to the surface of the molding layer 510 in contact with the second carrier substrate 820.

According to example embodiments of the inventive concept, the secondary sub-sawing process may be a laser cutting process. By the laser cutting process, a secondary sub-cut region CRb of a tapered shape of which a width is gradually narrowed in a laser irradiation direction may be formed. A side wall part of the semiconductor package 1000a formed by the secondary sub-sawing process may be formed to have inclination. The side wall part of the semiconductor package 1000a formed by the secondary sub-sawing process may have a different slope from that of the side wall part of the semiconductor package 1000a formed by the primary sub-sawing process. For the purposes of this specification, a side wall having a vertical orientation, e.g., parallel to the Z direction, is considered to have a vertical slope.

Figure 5:
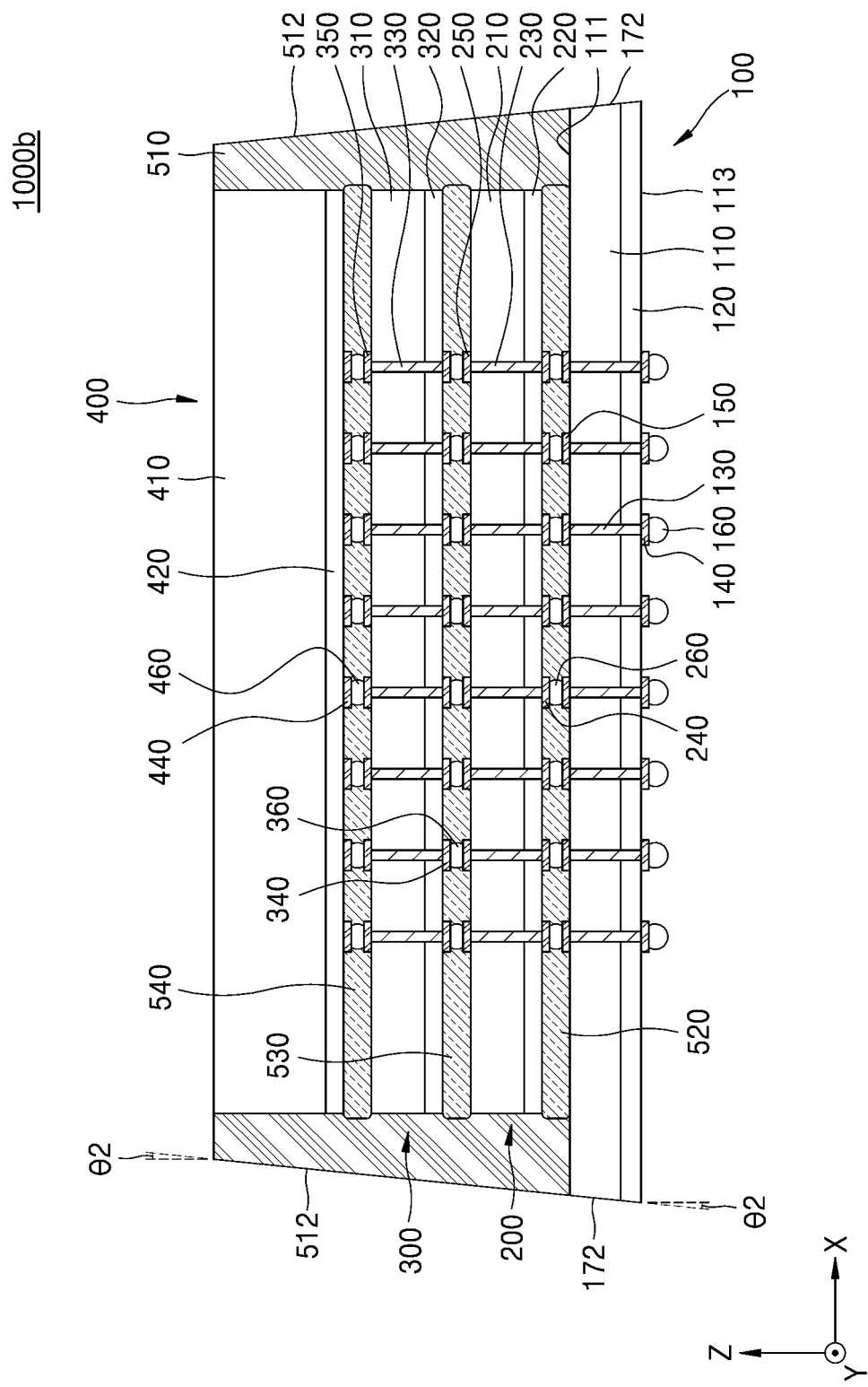
FIG. 5 is a cross-sectional view of a semiconductor package according to example embodiments of the inventive concept.

FIG. 5 is a cross-sectional view of a semiconductor package 1000b according to example embodiments of the inventive concept. The semiconductor package 1000b shown in FIG. 5 may be substantially the same as or similar to the semiconductor package 1000 shown in FIGS. 1A and 1B except for a shape or inclination of a side wall. Hereinafter, a difference from the semiconductor package 1000 shown in FIGS. 1A and 1B will be mainly described.

Referring to FIG. 5, a side wall 512 of the molding layer 510 may have a profile extending to be inclined inward (e.g., toward a center of the semiconductor package 1000a) from a lower end thereof to an upper end thereof. In the second direction (e.g., the X direction or the Y direction) that is parallel to the first surface 111 of the first semiconductor chip 100, a width of the upper surface of the molding layer 510 in the second direction (e.g., the X direction or the Y direction) may be less than a width of the lower surface of the molding layer 510 in the second direction (e.g., the X direction or the Y direction). According to example embodiments of the inventive concept, a width of the molding layer 510 in the second direction (e.g., the X direction or the Y direction) may decrease away from the first semiconductor chip 100 (e.g., away from the semiconductor chip of the package that includes external connection terminals for communicating outside of the semiconductor package). For example, as shown in FIG. 5, a cross-section of the molding layer 510 cut in the vertical direction may have a trapezoidal shape, with a longer bottom edge than top edge.

A side wall 172 of the first semiconductor chip 100 may have a profile extending to be inclined inward from a lower end thereof to an upper end thereof. The side wall 172 of the first semiconductor chip 100 may be connected to the side wall 512 of the molding layer 510. According to example embodiments of the inventive concept, the side wall 512 of the molding layer 510 and the side wall 172 of the first semiconductor chip 100 may have the same slope and be on the same plane. According to example embodiments of the inventive concept, the side wall 512 of the molding layer 510 and the side wall 172 of the first semiconductor chip 100 may extend to be inclined at the same second angle θ2 of inclination with respect to the first direction (e.g., the Z direction). According to example embodiments of the inventive concept, the second angle θ2 of inclination may be about 0.5° to about 5°.

According to example embodiments of the inventive concept, the side wall 512 of the molding layer 510 and the side wall 172 of the first semiconductor chip 100 may form a whole, continuous side wall of the semiconductor package 1000b. Because the side wall 512 of the molding layer 510 and the side wall 172 of the first semiconductor chip 100, which form the side wall of the semiconductor package 1000b, extend to be inclined with respect to the first direction (e.g., the Z direction), the side wall of the semiconductor package 1000b may also extend to be inclined with respect to the first direction (e.g., the Z direction). For example, the side wall of the semiconductor package 1000b may have a profile having a constant slope and extending to be inclined inward from a lower end thereof to an upper end thereof. For example, as shown in FIG. 5, a cross-section of the semiconductor package 1000b cut in the vertical direction may have a trapezoidal shape.

Figure 6:
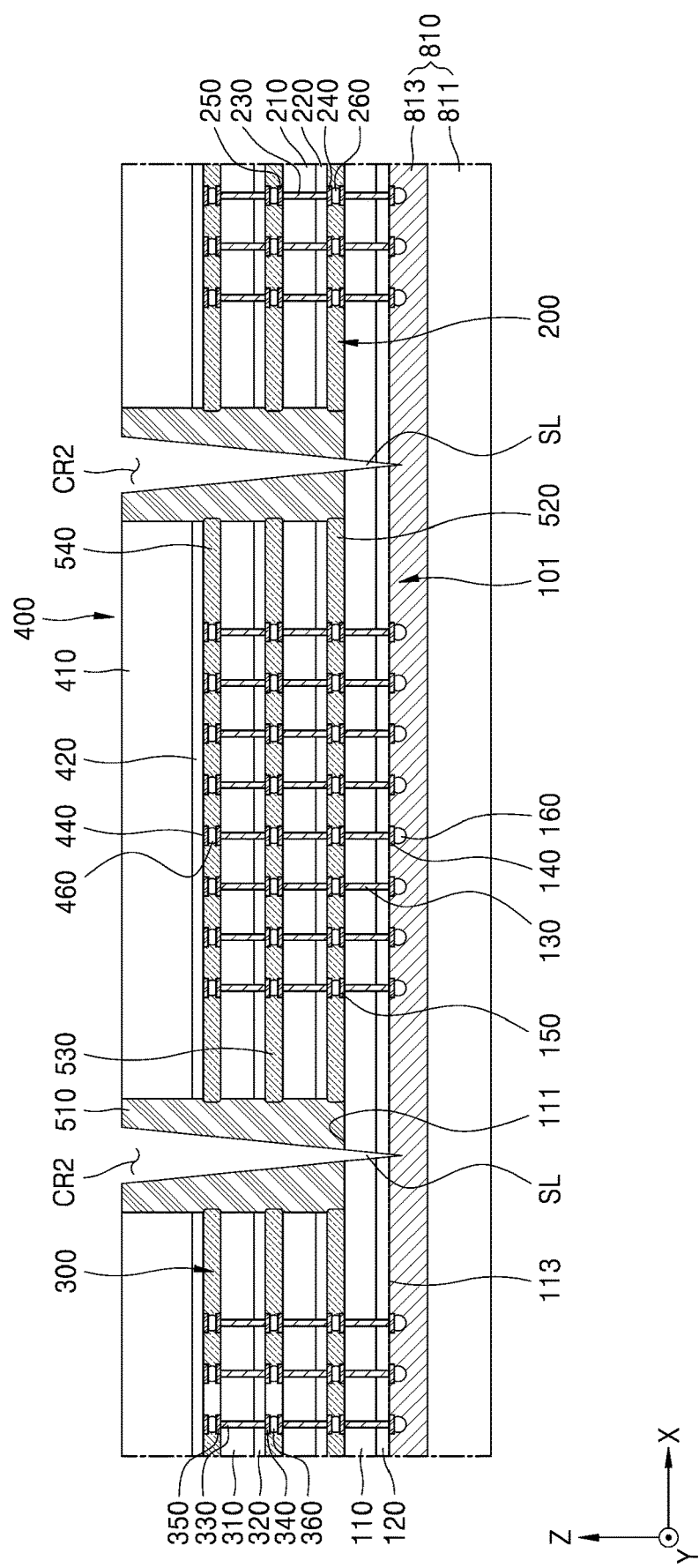
FIG. 6 is a cross-sectional view to describe a method of manufacturing a semiconductor package, according to example embodiments of the inventive concept.

FIG. 6 is a cross-sectional view to describe a method of manufacturing a semiconductor package, according to example embodiments of the inventive concept. Hereinafter, a method of manufacturing the semiconductor package 1000b shown in FIG. 5 will be described with reference to FIG. 6 mainly based on a difference from the semiconductor package manufacturing method described with reference to FIGS. 2A to 2K.

Referring to both FIGS. 6 and 2G, a structure corresponding to a result of FIG. 2G is prepared, and a sawing process on the structure is performed. By the sawing process, a cut region CR2 extending from an exposed surface of the molding layer 510 to the second surface 113 of the first semiconductor wafer 101 and passing through the structure may be formed.

According to example embodiments of the inventive concept, the sawing process may be a laser cutting process. Because the cut region CR2 of a tapered shape of which a width is gradually narrowed in a laser irradiation direction by the laser cutting process, a side wall of the semiconductor package 1000b formed by the sawing process may be formed to have inclination.

Figure 7:
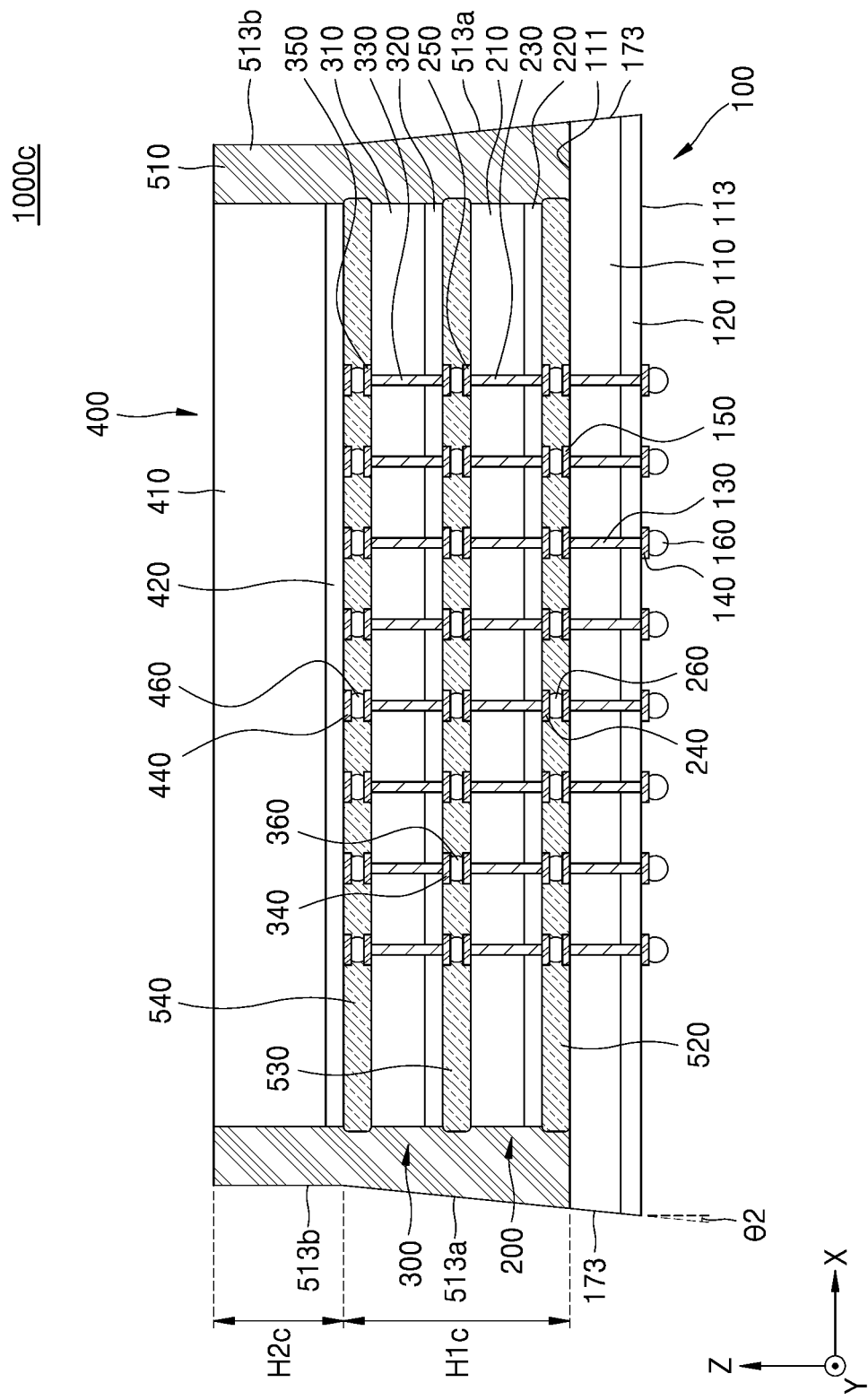
FIG. 7 is a cross-sectional view of a semiconductor package according to example embodiments of the inventive concept.

FIG. 7 is a cross-sectional view of a semiconductor package 1000c according to example embodiments of the inventive concept. The semiconductor package 1000c shown in FIG. 7 may be substantially the same as or similar to the semiconductor package 1000b shown in FIG. 5 except for a shape of a side wall. Hereinafter, a difference from the semiconductor package 1000b shown in FIG. 5 will be mainly described.

Referring to FIG. 7, each side wall of the molding layer 510 may include a first side wall 513a and a second side wall 513b having different slopes. The first side wall 513a and second side wall 513b may be described as a first side wall segment or portion, and a second side wall segment or portion, respectively. Similar descriptions may be used to describe other molding layer side walls below, which include at least two differently-sloped segments or portions. The first side wall 513a of the molding layer 510 may extend with a first slope from a lower end of the molding layer 510 to a first height H1c and extend with a second slope that is different from the first slope from the first height H1c to a second height H2c.

According to example embodiments of the inventive concept, the first side wall 513a of the molding layer 510 may have a profile extending to be inclined inward from a lower end thereof to an upper end thereof, and the second side wall 513b of the molding layer 510 may have a profile extending substantially in parallel to the first direction (e.g., the Z direction) orthogonal to the first surface 111 of the first semiconductor chip 100.

According to example embodiments of the inventive concept, a side wall 173 of the first semiconductor chip 100 may be connected to the first side wall 513a of the molding layer 510 and have the same first slope as the first side wall 513a of the molding layer 510. According to example embodiments of the inventive concept, the side wall 173 of the first semiconductor chip 100 and the first side wall 513a of the molding layer 510 may extend to be inclined at the same second angle θ2 of inclination with respect to the first direction (e.g., the Z direction) orthogonal to the first surface 111 of the first semiconductor chip 100, to be on the same plane.

According to example embodiments of the inventive concept, the side wall 173 of the first semiconductor chip 100, the first side wall 513a of the molding layer 510, and the second side wall 513b of the molding layer 510 may form a whole, continuous side wall of the semiconductor package 1000c. In this case, a side wall lower part and a side wall upper part of the semiconductor package 1000c may extend with different slopes.

According to example embodiments of the inventive concept, to manufacture the semiconductor package 1000c, a structure corresponding to the result of FIG. 2G may be prepared, and a cut region passing through the structure from an exposed surface of the molding layer 510 to the second surface 113 of the first semiconductor wafer 101 may be formed by sequentially performing a primary sub-sawing process and a secondary sub-sawing process on the structure.

According to example embodiments of the inventive concept, the primary sub-sawing process may be a blade cutting process, and the secondary sub-sawing process may be a laser cutting process. Because a primary sub-cut region formed by the primary sub-sawing process extends downward with a substantially uniform width, a side wall part of the semiconductor package 1000c formed by the primary sub-sawing process may have a profile extending in the vertical direction. In addition, because a secondary sub-cut region formed by the secondary sub-sawing process has a tapered shape of which a width is gradually narrowed downward, a side wall part of the semiconductor package 1000c formed by the secondary sub-sawing process may extend to be inclined.

Figure 8:
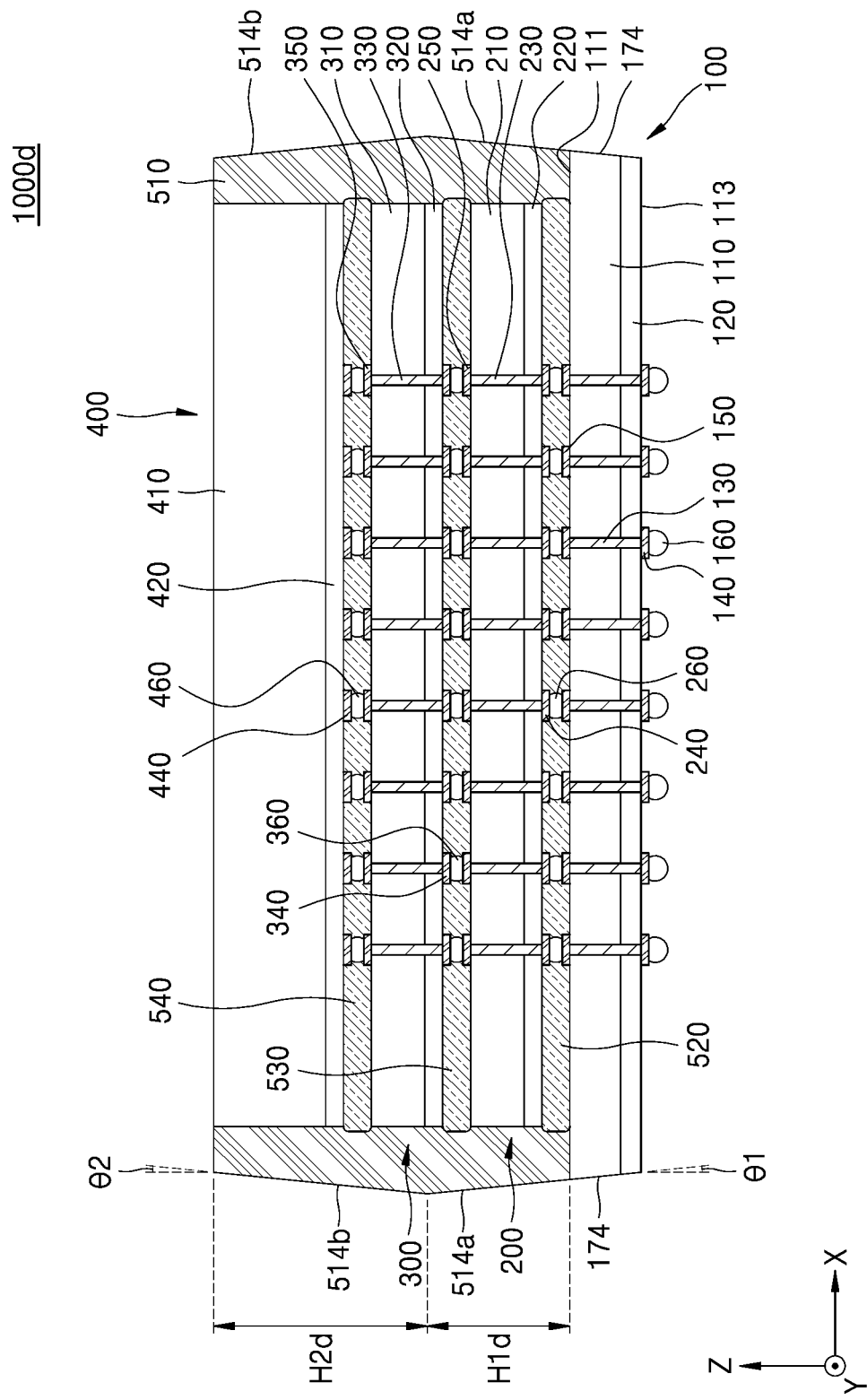
FIG. 8 is a cross-sectional view of a semiconductor package according to example embodiments of the inventive concept.

FIG. 8 is a cross-sectional view of a semiconductor package 1000d according to example embodiments of the inventive concept. The semiconductor package 1000d shown in FIG. 8 may be substantially the same as or similar to the semiconductor package 1000 shown in FIGS. 1A and 1B except for a shape of a side wall. Hereinafter, a difference from the semiconductor package 1000 shown in FIGS. 1A and 1B will be mainly described.

Referring to FIG. 8, a side wall (e.g., each side wall) of the semiconductor package 1000d may include a side wall lower part and a side wall upper part having different slopes. For example, the side wall lower part and the side wall upper part of the semiconductor package 1000d may extend with different slopes. For example, the side wall lower part of the semiconductor package 1000d may have a profile extending to be inclined outward in a direction away from the first semiconductor chip 100, and the side wall upper part of the semiconductor package 1000d may have a profile extending to be inclined inward in a direction away from the first semiconductor chip 100.

According to example embodiments of the inventive concept, the molding layer 510 may include a first side wall 514a and a second side wall 514b having different slopes. The first side wall 514a of the molding layer 510 may extend with the first slope from the lower end of the molding layer 510 to the first height, H1d and the second side wall 514b of the molding layer 510 may extend with the second slope that is different from the first slope from the first height H1d to the second height H2d. The first side wall 514a of the molding layer 510 may have a profile extending to be inclined outward from a lower end thereof to an upper end thereof, and the second side wall 514b of the molding layer 510 may have a profile extending to be inclined inward from a lower end thereof to an upper end thereof. In this case, a width of the molding layer 510 in the second direction (e.g., the X direction or the Y direction) that is parallel to the first surface 111 of the first semiconductor chip 100 may be maximum at the first height H1d at which the first side wall 514a meets the second side wall 514b.

According to example embodiments of the inventive concept, a side wall 174 of the first semiconductor chip 100 may be connected to the first side wall 514a of the molding layer 510 and have the same first slope as the first side wall 514a of the molding layer 510. According to example embodiments of the inventive concept, the side wall 174 of the first semiconductor chip 100 and the first side wall 514a of the molding layer 510 may extend to be inclined at the same first angle θ1 of inclination with respect to the first direction (e.g., the Z direction) orthogonal to the first surface 111 of the first semiconductor chip 100, to be on the same plane.

According to example embodiments of the inventive concept, the side wall lower part of the semiconductor package 1000d may have a profile extending to be inclined outward, and the side wall upper part of the semiconductor package 1000d may have a profile extending to be inclined inward. For example, as shown in FIG. 8, a cross-section of the semiconductor package 1000d cut in the vertical direction may have a hexagonal shape. In this case, in the second direction (e.g., the X direction or the Y direction) that is parallel to the first surface 111 of the first semiconductor chip 100, a width of the semiconductor package 1000d may have a maximum value between an upper surface and a lower surface of the semiconductor package 1000d. For example, the width of the semiconductor package 1000d may be maximum at the first height H1d at which the first side wall 514a meets the second side wall 514b.

Figure 9A:
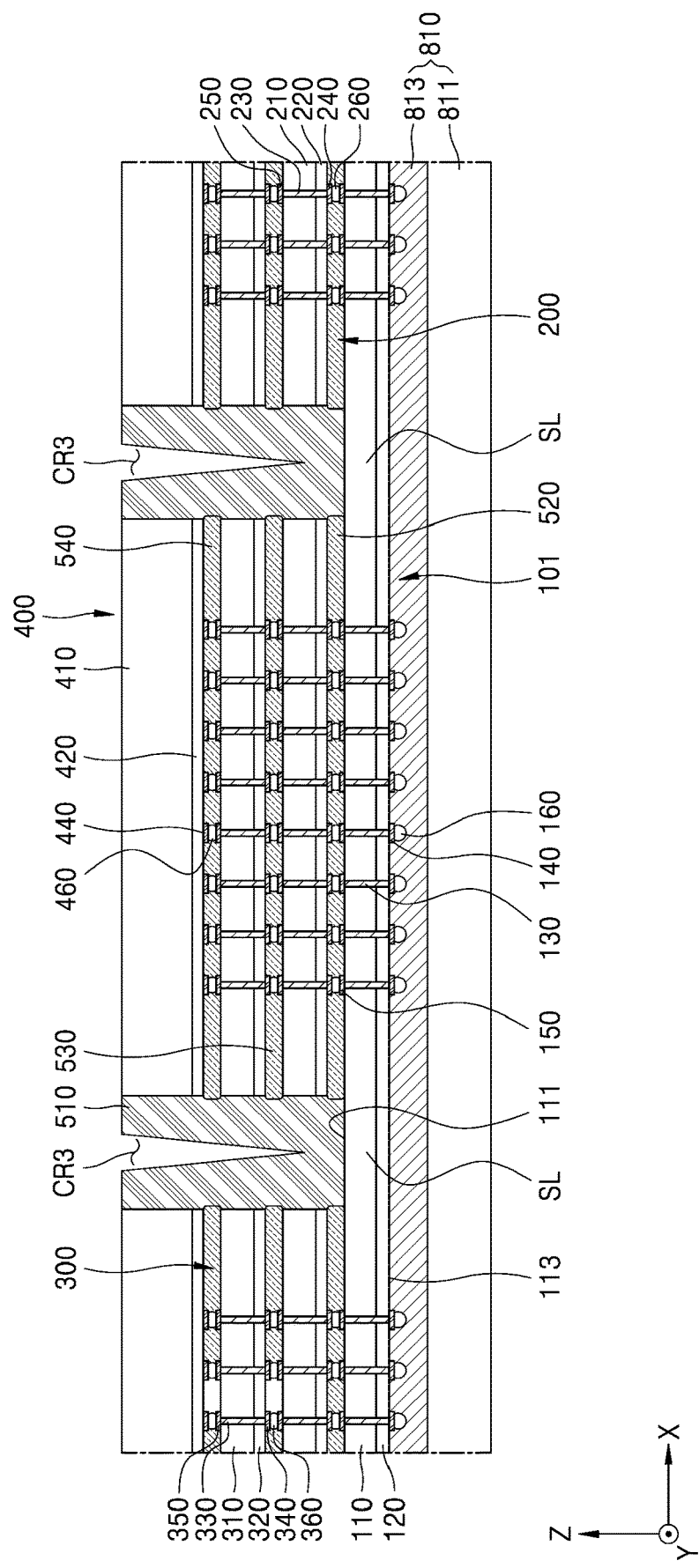
FIGS. 9A to 9C are cross-sectional views to describe a method of manufacturing a semiconductor package, according to example embodiments of the inventive concept.
Figure 9B:
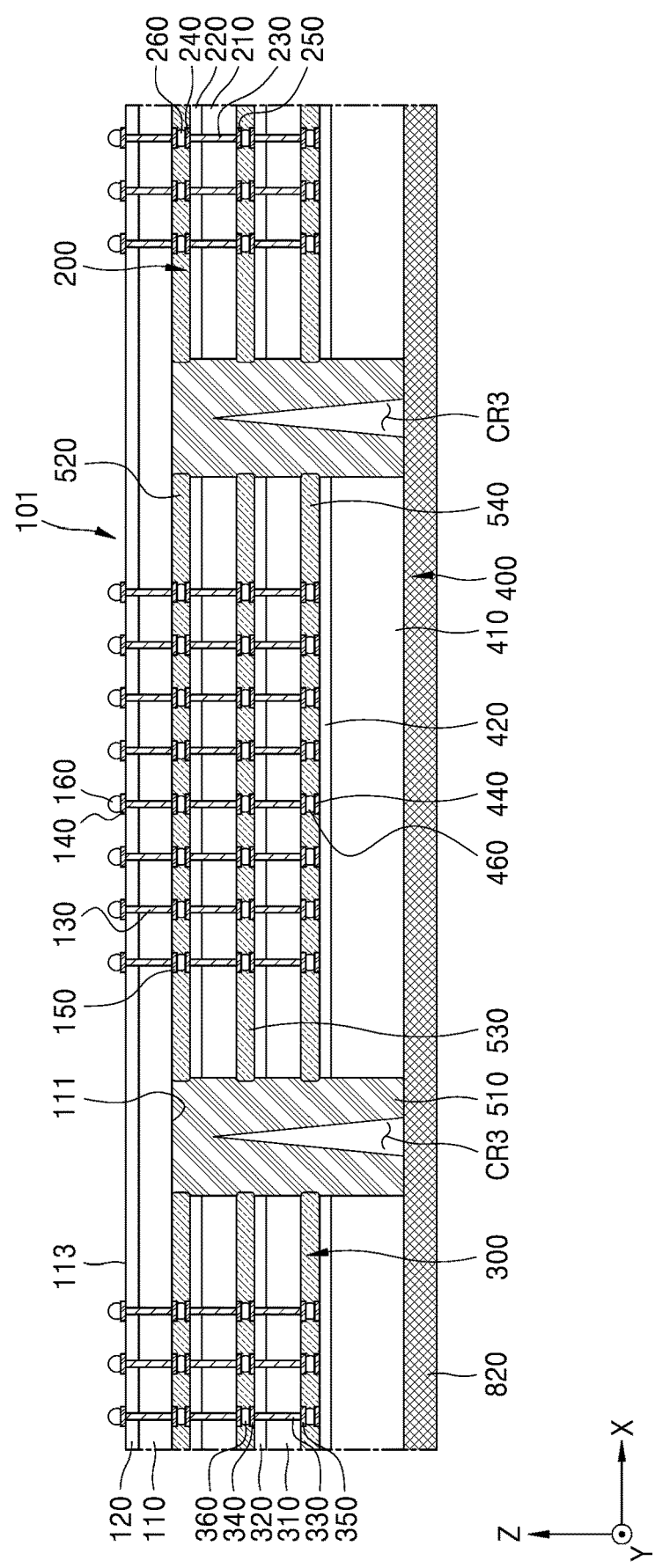
Figure 9C:
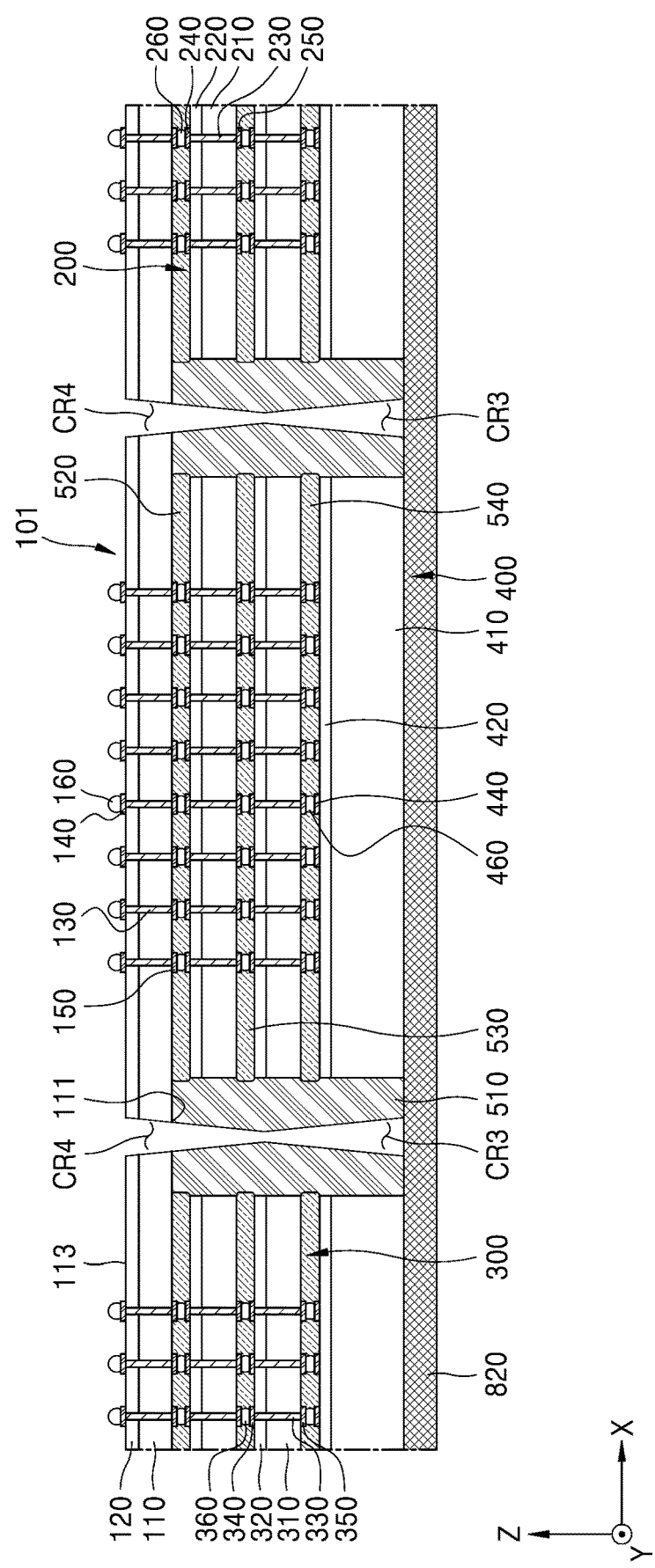

FIGS. 9A to 9C are cross-sectional views to describe a method of manufacturing a semiconductor package, according to example embodiments of the inventive concept.

Hereinafter, a method of manufacturing the semiconductor package 1000d shown in FIG. 8 will be described with reference to FIGS. 9A to 9C.

Referring to both FIGS. 9A and 2G, a structure corresponding to the result of FIG. 2G is prepared, and a primary cut region CR3 partially passing through the structure is formed by performing a primary sawing process on the structure. The primary cut region CR3 partially passes through the molding layer 510 from an exposed surface of the molding layer 510 but does not pass through the entire structure.

According to example embodiments of the inventive concept, the primary sawing process may be a laser cutting process. In this case, because the primary cut region CR3 has a tapered shape of which a width is gradually narrowed downward, a side wall part of the molding layer 510 formed by the primary sawing process may have inclination.

Referring to FIG. 9B, the second carrier substrate 820 is attached onto the result of FIG. 9A. Thereafter, the result of FIG. 9A is turned over, and then, the first carrier substrate 810 is removed to expose the second surface 113 of the first semiconductor wafer 101.

Referring to FIG. 9C, a secondary sawing process of cutting a result of FIG. 9B along the scribe lane SL of the first semiconductor wafer 101 may be performed. By the secondary sawing process, the result of FIG. 9B may be divided into semiconductor packages including the first to fourth semiconductor chips 100, 200, 300, and 400 as shown in FIG. 9C. In the secondary sawing process, a secondary cut region CR4 communicating with the primary cut region CR3 may be formed. The secondary cut region CR4 may be formed to extend downward from the second surface 113 of the first semiconductor wafer 101 and communicate with the primary cut region CR3. For example, the primary cut region CR3 and the secondary cut region CR4 may together form a continuous opening.

According to example embodiments of the inventive concept, the secondary sawing process may be a laser cutting process. In this case, because the secondary cut region CR4 has a tapered shape of which a width is gradually narrowed downward, a side wall part of the molding layer 510 formed by the secondary sawing process may have inclination. In this case, because a laser irradiation direction of the primary sawing process differs from a laser irradiation direction of the secondary sawing process, a side wall part of the semiconductor package 1000d formed in the primary sawing process and a side wall part of the semiconductor package 1000d formed in the secondary sawing process may have different slopes.

Figure 10:
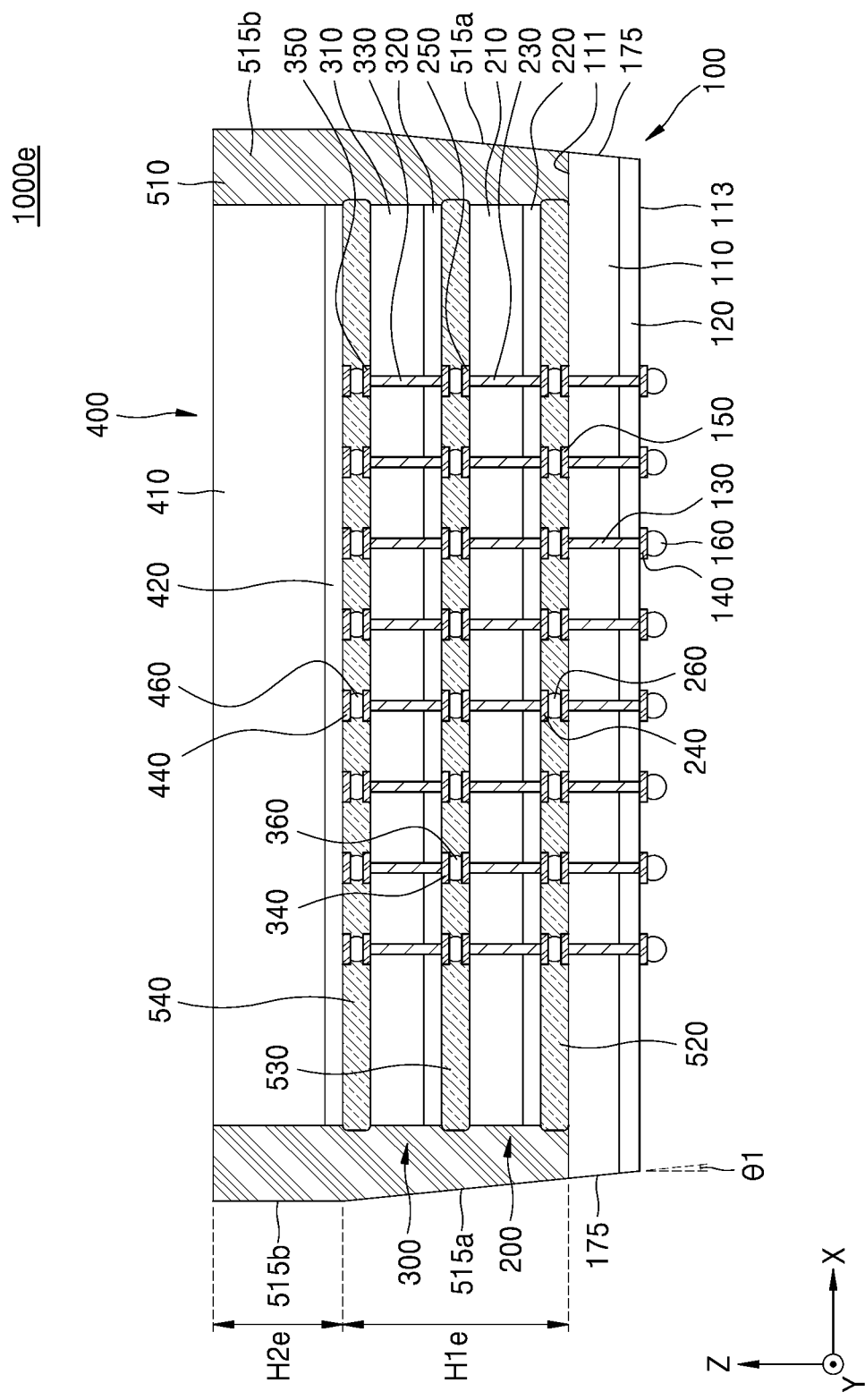
FIG. 10 is a cross-sectional view of a semiconductor package according to example embodiments of the inventive concept.

FIG. 10 is a cross-sectional view of a semiconductor package 1000e according to example embodiments of the inventive concept. The semiconductor package 1000e shown in FIG. 10 may be substantially the same as or similar to the semiconductor package 1000 shown in FIGS. 1A and 1B except for a shape of a side wall. Hereinafter, a difference from the semiconductor package 1000 shown in FIGS. 1A and 1B will be mainly described.

Referring to FIG. 10, the molding layer 510 (e.g., each side wall of the molding layer 510) may include a first side wall 515a and a second side wall 515b having different slopes. The first side wall 515a of the molding layer 510 may extend with the first slope from the lower end of the molding layer 510 to the first height, H1e and the second side wall 515b of the molding layer 510 may extend with the second slope that is different from the first slope from the first height H1e to the second height H2e.

According to example embodiments of the inventive concept, the first side wall 515a of the molding layer 510 may have a profile extending to be inclined outward from a lower end thereof to an upper end thereof, and the second side wall 515b of the molding layer 510 may have a profile extending substantially in parallel to the first direction (e.g., the Z direction) orthogonal to the first surface 111 of the first semiconductor chip 100.

According to example embodiments of the inventive concept, a side wall 175 of the first semiconductor chip 100 may be connected to the first side wall 515a of the molding layer 510 and have the same first slope as the first side wall 515a of the molding layer 510. According to example embodiments of the inventive concept, the side wall 175 of the first semiconductor chip 100 and the first side wall 515a of the molding layer 510 may extend to be inclined at the same first angle θ1 of inclination with respect to the first direction (e.g., the Z direction) orthogonal to the first surface 111 of the first semiconductor chip 100, to be on the same plane.

According to example embodiments of the inventive concept, to manufacture the semiconductor package 1000e, a structure corresponding to the result of FIG. 2G may be prepared, and a primary sawing process of forming a first cut region by using a blade cutting process to partially remove the structure downward from an exposed surface of the molding layer 510 and a secondary sawing process of forming a second cut region by removing the first carrier substrate 810 and then using a laser cutting process to partially remove the structure upward from the second surface 113 of the first semiconductor wafer 101, which is exposed by removing the first carrier substrate 810, may be performed. In this case, a side wall upper part of the semiconductor package 1000e formed by the blade cutting process may be formed to have a profile extending in the vertical direction, and a side wall lower part of the semiconductor package 1000e formed by the laser cutting process may be formed to have inclination.

Figure 11:
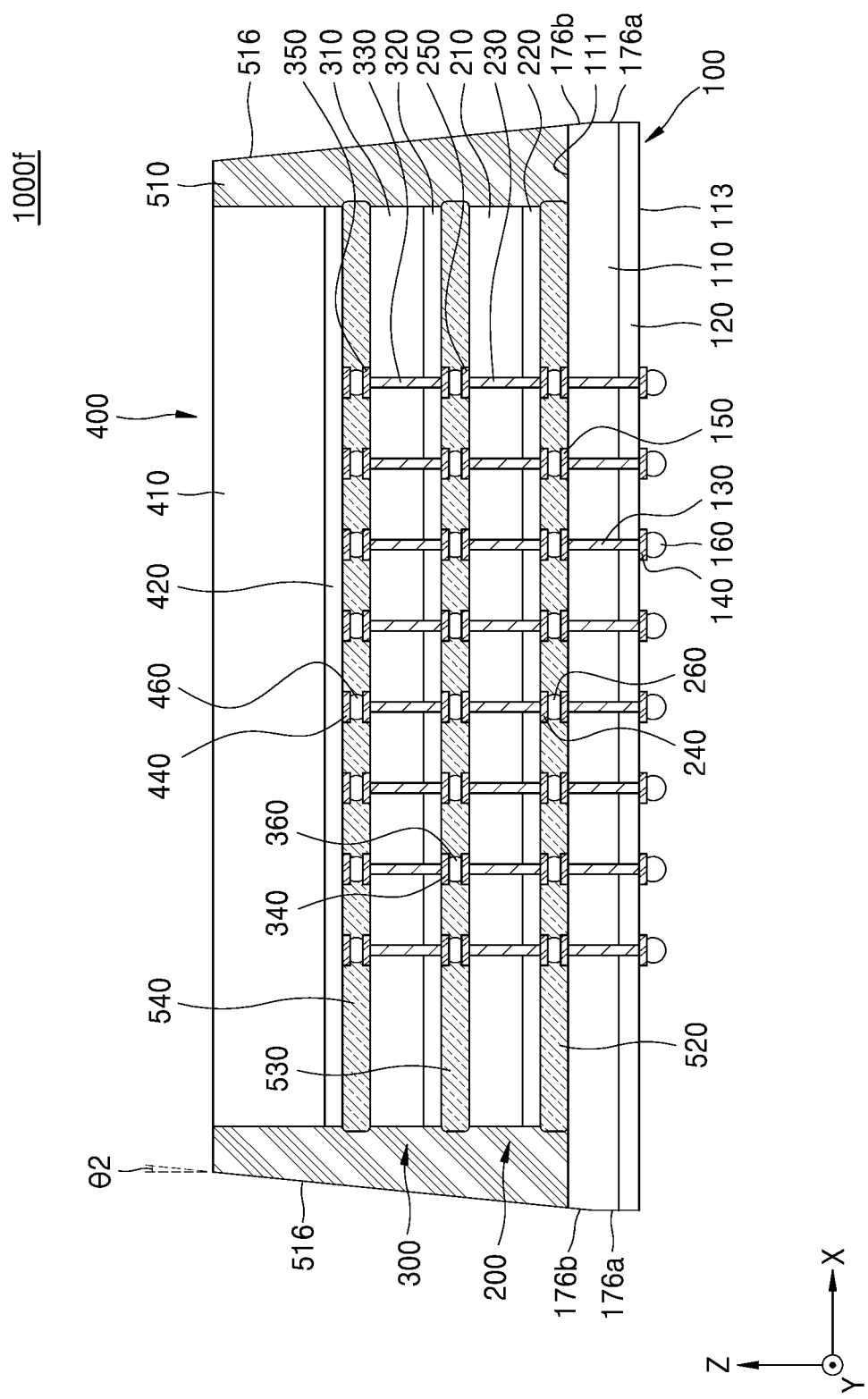
FIG. 11 is a cross-sectional view of a semiconductor package according to example embodiments of the inventive concept.

FIG. 11 is a cross-sectional view of a semiconductor package 1000f according to example embodiments of the inventive concept. The semiconductor package 1000f shown in FIG. 11 may be substantially the same as or similar to the semiconductor package 1000b shown in FIG. 5 except for a shape of a side wall. Hereinafter, a difference from the semiconductor package 1000b shown in FIG. 5 will be mainly described.

Referring to FIG. 11, for each side wall of the semiconductor package 100f, a side wall lower part 176a and a side wall upper part 176b of the first semiconductor chip 100 may have different slopes. According to example embodiments of the inventive concept, the side wall lower part 176a of the first semiconductor chip 100 may have a profile extending substantially in parallel to the first direction (e.g., the Z direction) orthogonal to the first surface 111 of the first semiconductor chip 100, and the side wall upper part 176b of the first semiconductor chip 100 may have a profile extending to be inclined inward from a lower end thereof to an upper end thereof.

According to example embodiments of the inventive concept, the side wall upper part 176b of the first semiconductor chip 100 may be connected to a side wall 516 of the molding layer 510 and have the same first slope as the side wall 516 of the molding layer 510. According to example embodiments of the inventive concept, the side wall upper part 176b of the first semiconductor chip 100 and the side wall 516 of the molding layer 510 may extend to be inclined at the same second angle θ2 of inclination with respect to the first direction (e.g., the Z direction) orthogonal to the first surface 111 of the first semiconductor chip 100, and to be on the same plane.

According to example embodiments of the inventive concept, to manufacture the semiconductor package 1000f, a structure corresponding to the result of FIG. 2G may be prepared, and a primary sawing process of forming a first cut region by using a laser cutting process to partially remove the structure downward from an exposed surface of the molding layer 510 and a secondary sawing process of forming a second cut region by removing the first carrier substrate 810 and then using a blade cutting process to partially remove the structure upward from the second surface 113 of the first semiconductor wafer 101, which is exposed by removing the first carrier substrate 810, may be performed. In this case, a side wall upper part of the semiconductor package 1000f formed by the laser cutting process may be formed to have inclination, and a side wall lower part of the semiconductor package 1000f formed by the blade cutting process may be formed to have a profile extending in the vertical direction.

Figure 12:
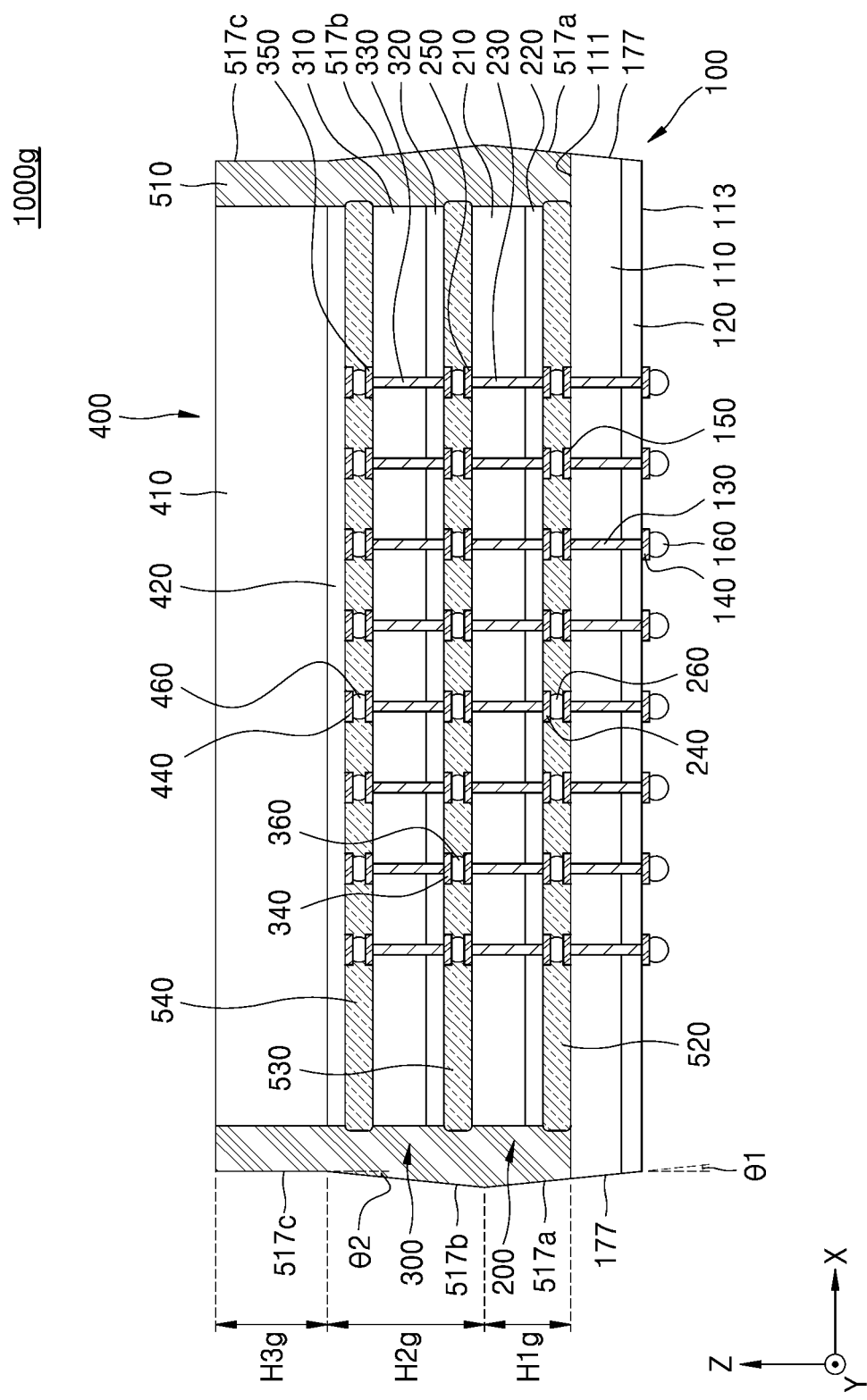
FIG. 12 is a cross-sectional view of a semiconductor package according to example embodiments of the inventive concept.

FIG. 12 is a cross-sectional view of a semiconductor package 1000g according to example embodiments of the inventive concept. The semiconductor package 1000g shown in FIG. 12 may be substantially the same as or similar to the semiconductor package 1000d shown in FIG. 8 except for a shape of a side wall. Hereinafter, a difference from the semiconductor package 1000d shown in FIG. 8 will be mainly described.

Referring to FIG. 12, each side wall of the molding layer 510 may include a first side wall 517a, a second side wall 517b, and a third side wall 517c having different slopes. The first side wall 517a of the molding layer 510 may extend with the first slope from the lower end of the molding layer 510 to the first height H1g, the second side wall 517b of the molding layer 510 may extend with the second slope from the first height H1g to the second height H2g, and the third side wall 517c of the molding layer 510 may extend with a third slope from the second height H2g to a third height H3g. The first side wall 517a of the molding layer 510 may have a profile extending to be inclined outward from a lower end thereof to an upper end thereof, the second side wall 517b of the molding layer 510 may have a profile extending to be inclined inward from a lower end thereof to an upper end thereof, and the third side wall 517c of the molding layer 510 may have a profile extending in the first direction (e.g., the Z direction) orthogonal to the first surface 111 of the first semiconductor chip 100.

According to example embodiments of the inventive concept, a side wall 177 of the first semiconductor chip 100 may be connected to the first side wall 517a of the molding layer 510 and have the same first slope as the first side wall 517a of the molding layer 510. According to example embodiments of the inventive concept, the side wall 177 of the first semiconductor chip 100 and the first side wall 517a of the molding layer 510 may extend to be inclined at the same first angle θ1 of inclination with respect to the first direction (e.g., the Z direction) orthogonal to the first surface 111 of the first semiconductor chip 100, and to be on the same plane. The second side wall 517b of the molding layer 510 may extend at the second angle θ2 of inclination with respect to the first direction (e.g., the Z direction).

Because the molding layer 510 forming each side wall of the semiconductor package 1000g has first to third side walls 517a, 517b, and 517c, a profile of the side wall of the semiconductor package 1000g may include a combination of three straight lines having different slopes. For example, the side wall of the semiconductor package 1000g may include a side wall lower part extending to be inclined outward, a side wall intermediate part extending to be inclined inward from an upper end of the side wall lower part, and a side wall upper part extending in the vertical direction from an upper end of the side wall intermediate part.

According to example embodiments of the inventive concept, to manufacture the semiconductor package 1000g, a structure corresponding to the result of FIG. 2G may be prepared, and a primary sawing process of forming a first cut region by sequentially performing a blade cutting process and a laser cutting process to partially remove the structure downward from an exposed surface of the molding layer 510 and a secondary sawing process of forming a second cut region by removing the first carrier substrate 810 and then using a blade cutting process to partially remove the structure upward from the second surface 113 of the first semiconductor wafer 101, which is exposed by removing the first carrier substrate 810, may be performed.

Figure 13:
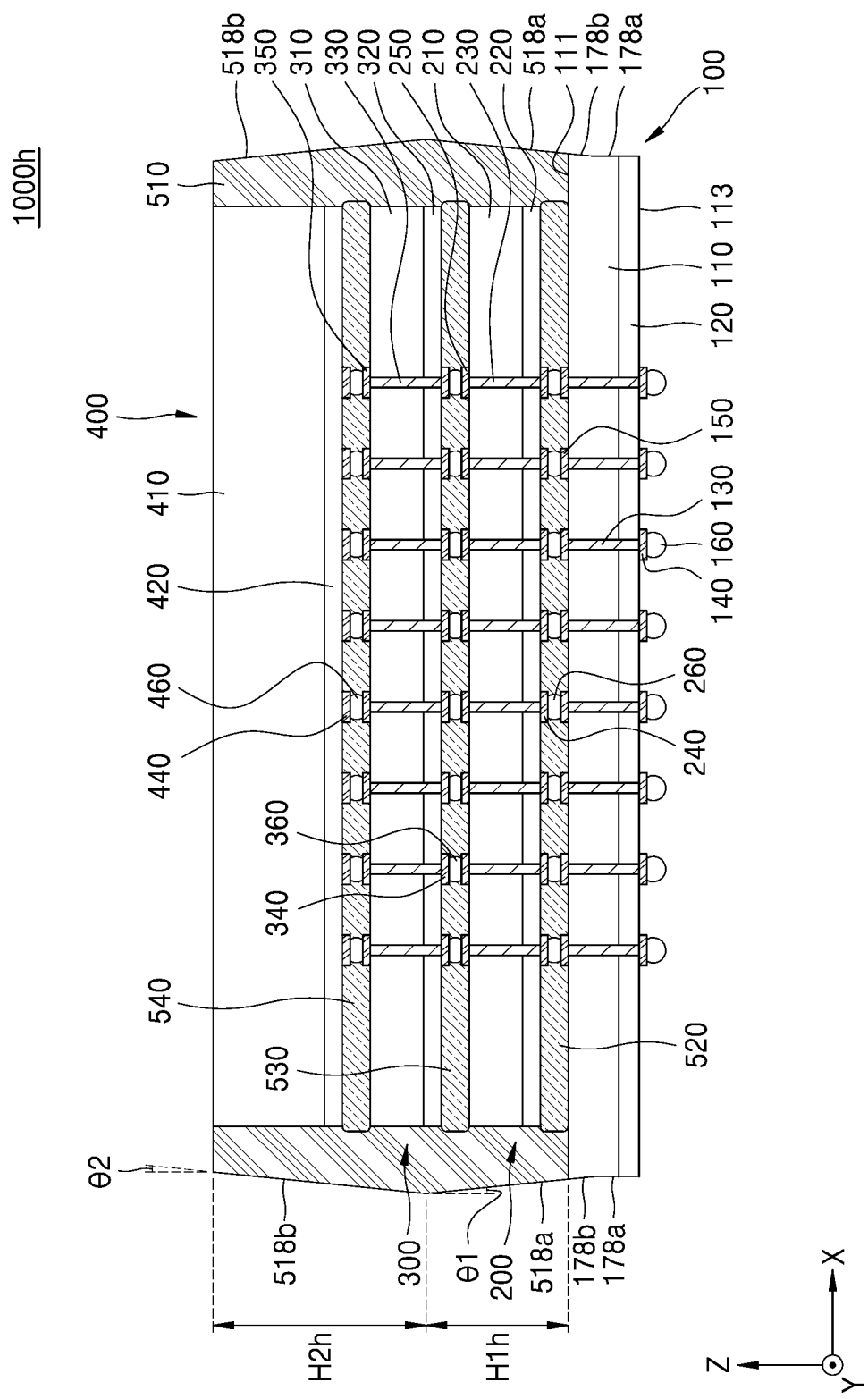
FIG. 13 is a cross-sectional view of a semiconductor package according to example embodiments of the inventive concept.

FIG. 13 is a cross-sectional view of a semiconductor package 1000h according to example embodiments of the inventive concept. The semiconductor package 1000h shown in FIG. 13 may be substantially the same as or similar to the semiconductor package 1000d shown in FIG. 8 except for a shape of a side wall. Hereinafter, a difference from the semiconductor package 1000d shown in FIG. 8 will be mainly described.

Referring to FIG. 13, each side wall of the molding layer 510 may include a first side wall 518a and a second side wall 518b having different slopes. The first side wall 518a of the molding layer 510 may extend with the first slope from the lower end of the molding layer 510 to the first height H1h, and the second side wall 518b of the molding layer 510 may extend with the second slope from the first height H1h to the second height H2h. The first side wall 518a of the molding layer 510 may have a profile extending to be inclined outward from a lower end thereof to an upper end thereof, and the second side wall 518b of the molding layer 510 may have a profile extending to be inclined inward from a lower end thereof to an upper end thereof.

According to example embodiments of the inventive concept, a side wall upper part 178b and a side wall lower part 178a of the first semiconductor chip 100 may have different slopes. According to example embodiments of the inventive concept, the side wall lower part 178a of the first semiconductor chip 100 may have a profile extending substantially in parallel to the first direction (e.g., the Z direction) orthogonal to the first surface 111 of the first semiconductor chip 100, and the side wall upper part 178b of the first semiconductor chip 100 may have a profile extending to be inclined outward from a lower end thereof to an upper end thereof.

According to example embodiments of the inventive concept, the side wall upper part 178b of the first semiconductor chip 100 may be connected to the side wall 511 of the molding layer 510 and have the same first slope as the side wall 511 of the molding layer 510. According to example embodiments of the inventive concept, the side wall upper part 178b of the first semiconductor chip 100 and the side wall 511 of the molding layer 510 may extend to be inclined at the same first angle θ1 of inclination with respect to the first direction (e.g., the Z direction) orthogonal to the first surface 111 of the first semiconductor chip 100.

As shown in FIG. 13, a profile of a side wall of the semiconductor package 1000h may include a combination of three straight lines having different slopes. For example, the side wall of the semiconductor package 1000h may include a side wall lower part extending in the vertical direction, a side wall intermediate part extending to be inclined outward from an upper end of the side wall lower part, and a side wall upper part extending to be inclined inward from an upper end of the side wall intermediate part.

According to example embodiments of the inventive concept, to manufacture the semiconductor package 1000h, a structure corresponding to the result of FIG. 2G may be prepared, and a primary sawing process of forming a first cut region by using a laser cutting process to partially remove the structure downward from an exposed surface of the molding layer 510 and a secondary sawing process of forming a second cut region by removing the first carrier substrate 810 and then sequentially performing a blade cutting process and a laser cutting process to partially remove the structure upward from the second surface 113 of the first semiconductor wafer 101, which is exposed by removing the first carrier substrate 810, may be performed.

Figure 14:
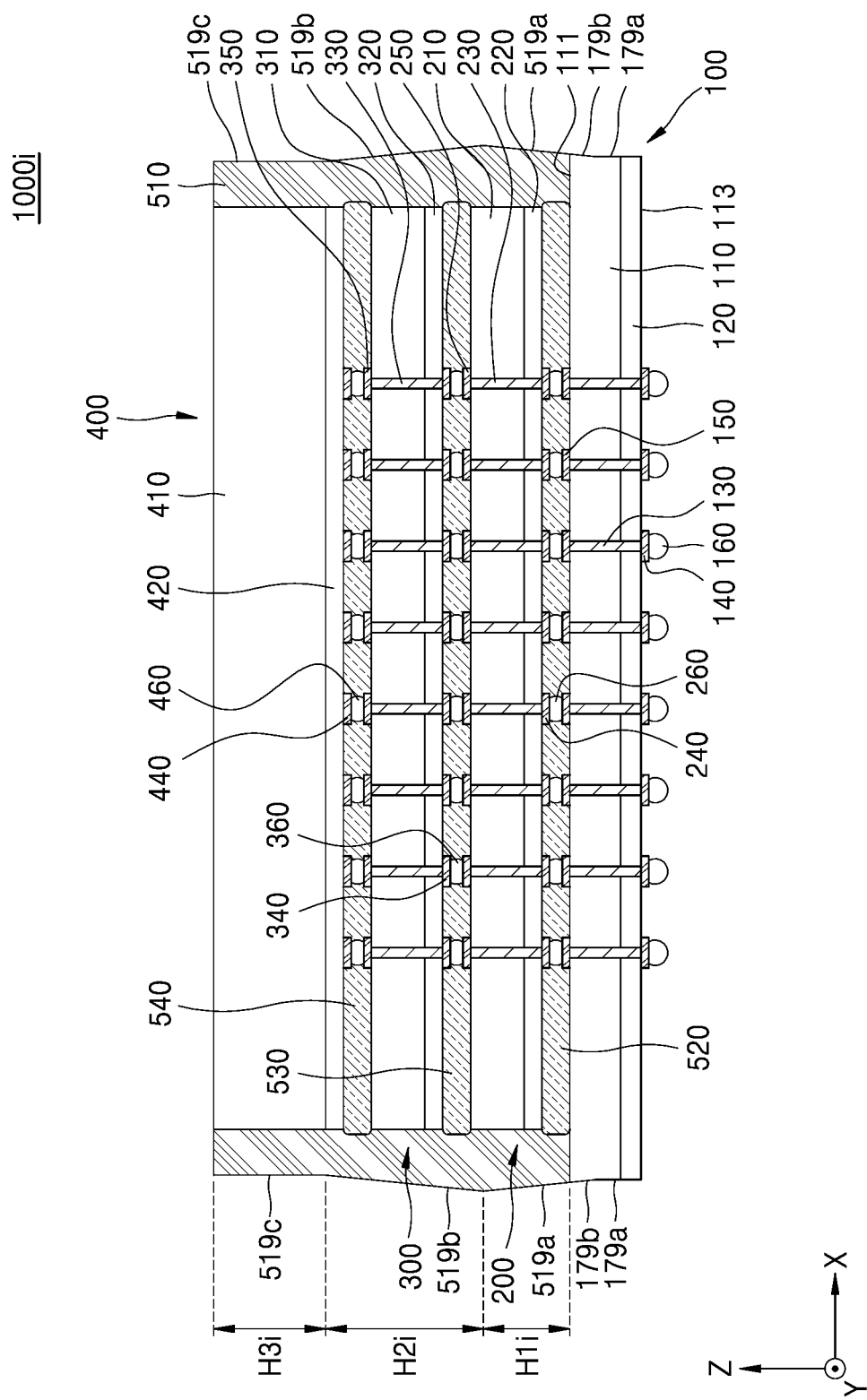
FIG. 14 is a cross-sectional view of a semiconductor package according to example embodiments of the inventive concept.

FIG. 14 is a cross-sectional view of a semiconductor package 1000i according to example embodiments of the inventive concept. The semiconductor package 1000i shown in FIG. 14 may be substantially the same as or similar to the semiconductor package 1000d shown in FIG. 8 except for a shape of a side wall. Hereinafter, a difference from the semiconductor package 1000d shown in FIG. 8 will be mainly described.

Referring to FIG. 14, each side wall of the molding layer 510 may include a first side wall 519a, a second side wall 519b, and a third side wall 519c having different slopes. The first side wall 519a of the molding layer 510 may extend with the first slope from the lower end of the molding layer 510 to the first height H1i, the second side wall 519b of the molding layer 510 may extend with the second slope from the first height H1i to the second height, H2i and the third side wall 519c of the molding layer 510 may extend with the third slope from the second height H2i to the third height H3i. The first side wall 519a of the molding layer 510 may have a profile extending to be inclined outward from a lower end thereof to an upper end thereof, the second side wall 519b of the molding layer 510 may have a profile extending to be inclined inward from a lower end thereof to an upper end thereof, and the third side wall 519c of the molding layer 510 may have a profile extending substantially in parallel to the first direction (e.g., the Z direction) orthogonal to the first surface 111 of the first semiconductor chip 100.

According to example embodiments of the inventive concept, an upper part 179b and a lower part 179a of a side wall of the first semiconductor chip 100 may have different slopes. According to example embodiments of the inventive concept, the lower part 179a of the side wall of the first semiconductor chip 100 may have a profile extending substantially in parallel to the first direction (e.g., the Z direction) orthogonal to the first surface 111 of the first semiconductor chip 100, and the upper part 179b of the side wall of the first semiconductor chip 100 may have a profile extending to be upwardly inclined outward from a lower end thereof to an upper end thereof.

According to example embodiments of the inventive concept, the upper part 179b of the side wall of the first semiconductor chip 100 may be connected to the side wall 511 of the molding layer 510 and have the same first slope as the side wall 511 of the molding layer 510. According to example embodiments of the inventive concept, the upper part 179b of the side wall of the first semiconductor chip 100 and the side wall 511 of the molding layer 510 may extend to be inclined at the same first angle θ1 of inclination with respect to the first direction (e.g., the Z direction) orthogonal to the first surface 111 of the first semiconductor chip 100.

As shown in FIG. 14, a profile of each side wall of the semiconductor package 1000i may include a combination of four straight lines having different slopes. For example, the side wall of the semiconductor package 1000i may include a side wall lower part extending in the vertical direction, a first side wall intermediate part extending to be inclined outward from an upper end of the side wall lower part, a second side wall intermediate part extending to be inclined inward from an upper end of the first side wall intermediate part, and a side wall upper part extending in the vertical direction from an upper end of the second side wall intermediate part.

According to example embodiments of the inventive concept, to manufacture the semiconductor package 1000i, a structure corresponding to the result of FIG. 2G may be prepared, and a primary sawing process of forming a first cut region by sequentially performing a blade cutting process and a laser cutting process to partially remove the structure downward from an exposed surface of the molding layer 510 and a secondary sawing process of forming a second cut region by removing the first carrier substrate 810 and then sequentially performing a blade cutting process and a laser cutting process to partially remove the structure upward from the second surface 113 of the first semiconductor wafer 101, which is exposed by removing the first carrier substrate 810, may be performed.

Figure 15:
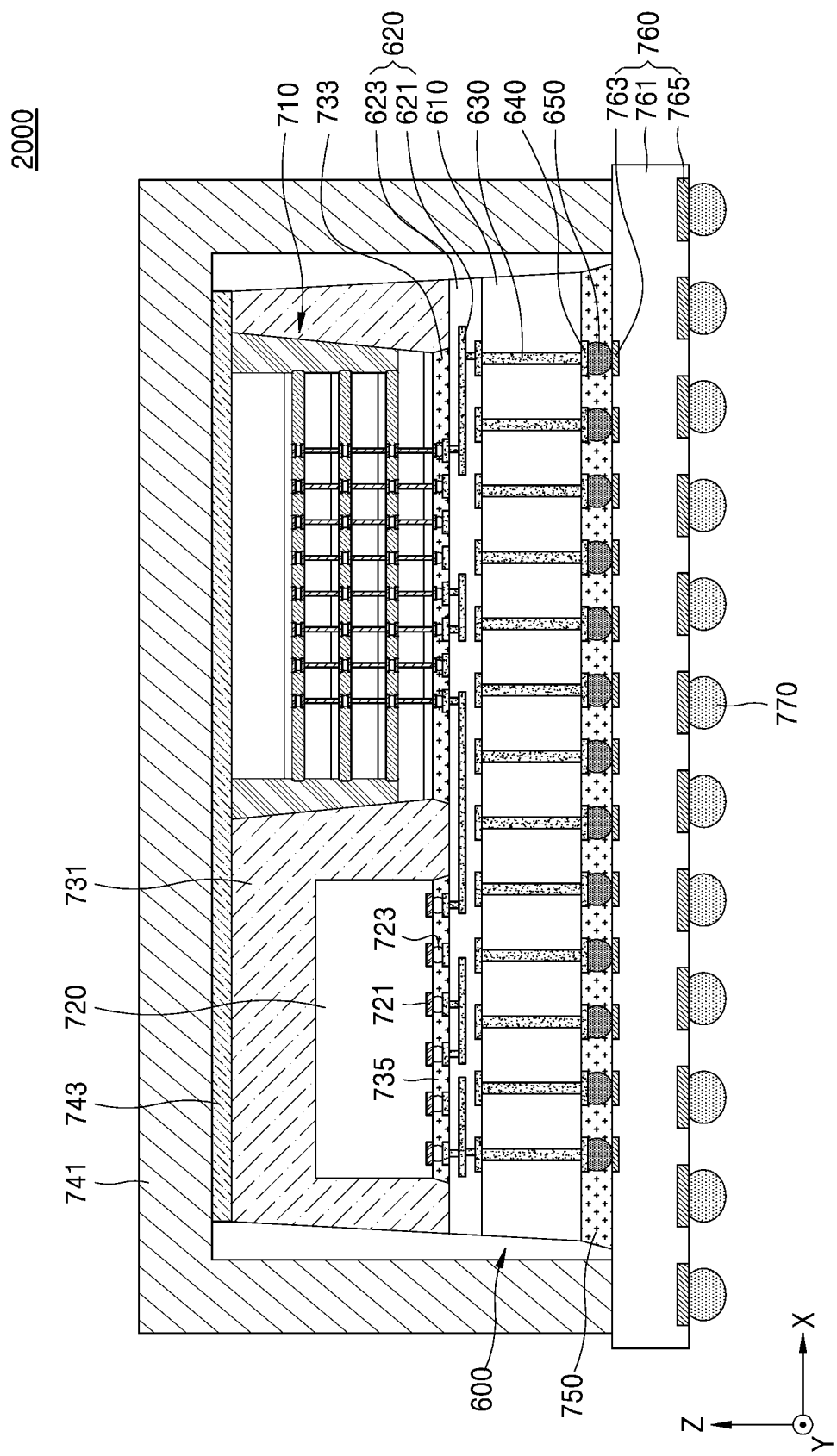
FIG. 15 is a cross-sectional view of a semiconductor package according to example embodiments of the inventive concept.

FIG. 15 is a cross-sectional view of a semiconductor package 2000 according to example embodiments of the inventive concept.

Referring to both FIGS. 15 and 1A, the semiconductor package 2000 may include a package board 760 (also described as a package substrate), an interposer 600 mounted on the package board 760, and a first semiconductor device 710 and a second semiconductor device 720 mounted on the interposer 600. Although the first semiconductor device 710 is the semiconductor package 1000 shown in FIGS. 1A and 1B, the first semiconductor device 710 is not limited thereto and may include the semiconductor package 1000a, 1000b, 1000c, 1000d, 1000e, 1000f, 1000g, 1000f, 1000h, or 1000i described with reference to FIGS. 3 to 14.

The interposer 600 may include a base layer 610, a rewiring structure 620, and interposer through electrodes 630.

The base layer 610 may include a semiconductor material, glass, ceramic, or plastic. According to example embodiments of the inventive concept, the base layer 610 may include an Si wafer including or formed of Si, e.g., crystalline Si, polycrystalline Si, or amorphous Si.

The rewiring structure 620 may include a rewiring insulating layer 623 covering a first surface 111 of the base layer 610 and a conductive rewiring pattern 621 sheathed by the rewiring insulating layer 623. The conductive rewiring pattern 621 may include, for example, a plurality of wiring layers forming a multi-layer structure and conductive vias extending in the vertical direction to electrically connect the plurality of wiring layers to each other. Some of the plurality of wiring layers may be formed on an upper surface of the base layer 610 to construct pads respectively connected to the interposer through electrodes 630. In addition, remaining ones of the plurality of wiring layers may be on an upper side of the rewiring insulating layer 623 to construct pads respectively connected to connection bumps for electrical connection to semiconductor devices to be mounted on the interposer 600.

The interposer through electrodes 630 may extend from the upper surface to a lower surface of the base layer 610 so as to pass through the base layer 610. The interposer through electrodes 630 may electrically connect the conductive rewiring pattern 621 of the rewiring structure 620 to lower connection pads 640 on the lower surface of the base layer 610, respectively. Board-interposer interconnection terminals 650 may be on the lower connection pads 640, respectively.

The first semiconductor device 710 and the second semiconductor device 720 may be mounted on the rewiring structure 620 of the interposer 600 to be apart from each other in the horizontal direction. The first semiconductor device 710 and the second semiconductor device 720 may be electrically connected to each other through the conductive rewiring pattern 621 of the rewiring structure 620. The first semiconductor device 710 may be mounted on the interposer 600 through the first connection bumps 160 on a lower surface of the first semiconductor device 710, and the second semiconductor device 720 may be mounted on the interposer 600 through chip connection bumps 723 attached to pads 721 of the second semiconductor device 720. A first underfill material layer 733 encompassing the first connection bumps 160 may be between the first semiconductor device 710 and the interposer 600, and a second underfill material layer 735 encompassing the chip connection bumps 723 may be between the second semiconductor device 720 and the interposer 600.

Although FIG. 15 shows two semiconductor devices mounted on the interposer 600 to be horizontally separated from each other, the semiconductor package 2000 may include three or more semiconductor devices mounted on the interposer 600, which may be horizontally separated from each other.

According to example embodiments of the inventive concept, the first semiconductor device 710 may include a stack-type memory device. For example, the first semiconductor device 710 may have a three-dimensional memory structure in which a plurality of chips are stacked. For example, the first semiconductor device 710 may be implemented based on the high bandwidth memory (HBM) or hybrid memory cube (HMC) standard.

The second semiconductor device 720 may include, for example, a system-on chip, a CPU chip, a GPU chip, or an AP chip. The second semiconductor device 720 may execute applications supported by the semiconductor package 2000, by using the first semiconductor device 710. For example, the second semiconductor device 720 may include at least one processor among a CPU, an AP, a GPU, a neural processing unit (NPU), a tensor processing unit (TPU), a vision processing unit (VPU), an image signal processor (ISP), and a digital signal processor (DSP) to execute particular computations.

The semiconductor package 2000 may further include a package molding layer 731 arranged on the interposer 600 and molding the first semiconductor device 710 and the second semiconductor device 720. The package molding layer 731 may include, for example, an EMC. According to example embodiments of the inventive concept, the package molding layer 731 may cover side walls of the first semiconductor device 710 and side walls of the second semiconductor device 720 but may not cover an upper surface of the first semiconductor device 710.

The semiconductor package 2000 may further include a heat-dissipating member 741 covering upper surfaces of the first semiconductor device 710 and the second semiconductor device 720. The heat-dissipating member 741 may include a heat-dissipating plate such as a heat slug or a heat sink. According to example embodiments of the inventive concept, the heat-dissipating member 741 may encompass and surround the first semiconductor device 710, the second semiconductor device 720, and the interposer 600 on an upper surface of the package board 760.

In addition, the semiconductor package 2000 may further include a thermal interface material (TIM) 743. The TIM 743 may be between the heat-dissipating member 741 and the first semiconductor device 710 and between the heat-dissipating member 741 and the second semiconductor device 720.

The package board 760 may be electrically connected to the interposer 600 through the board-interposer interconnection terminals 650. An underfill material layer 750 may be between the interposer 600 and the package board 760. The underfill material layer 750 may encompass the board-interposer interconnection terminals 650.

The package board 760 may include a board base 761 and board upper pads 763 and board lower pads 765 respectively on an upper surface and a lower surface of the board base 761. According to example embodiments of the inventive concept, the package board 760 may be a printed circuit board. For example, the package board 760 may be a multi-layer printed circuit board. The board base 761 may include or be formed of at least one material selected from among a phenol resin, an epoxy resin, and polyimide. The board-interposer interconnection terminals 650 may be connected to the board upper pads 763, and package connection terminals 770 configured to electrically connect an external device to the semiconductor package 2000 may be connected to the board lower pads 765.

Figure 16A:
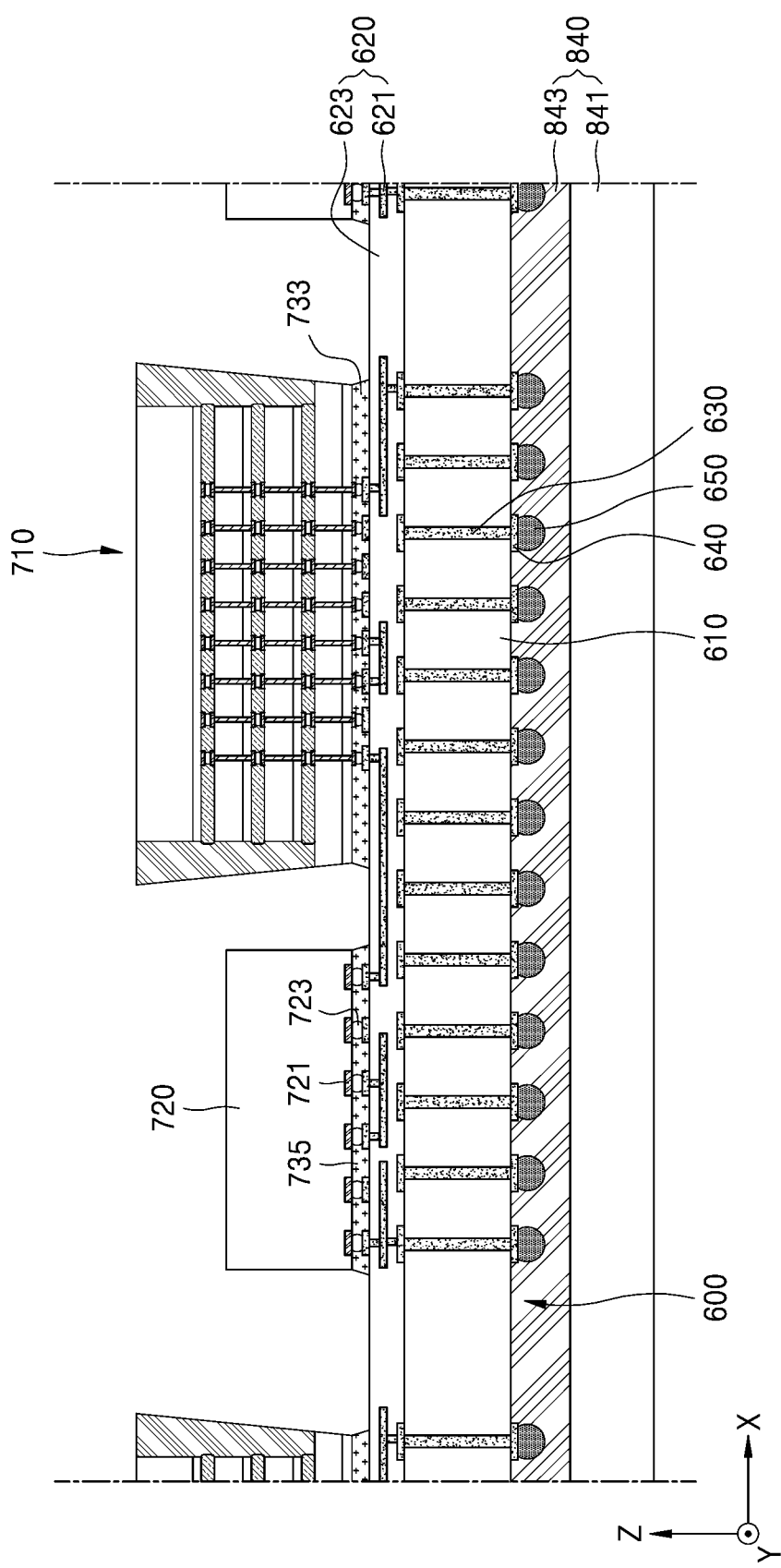
FIGS. 16A to 16C are cross-sectional views to describe a method of manufacturing a semiconductor package, according to example embodiments of the inventive concept.
Figure 16B:
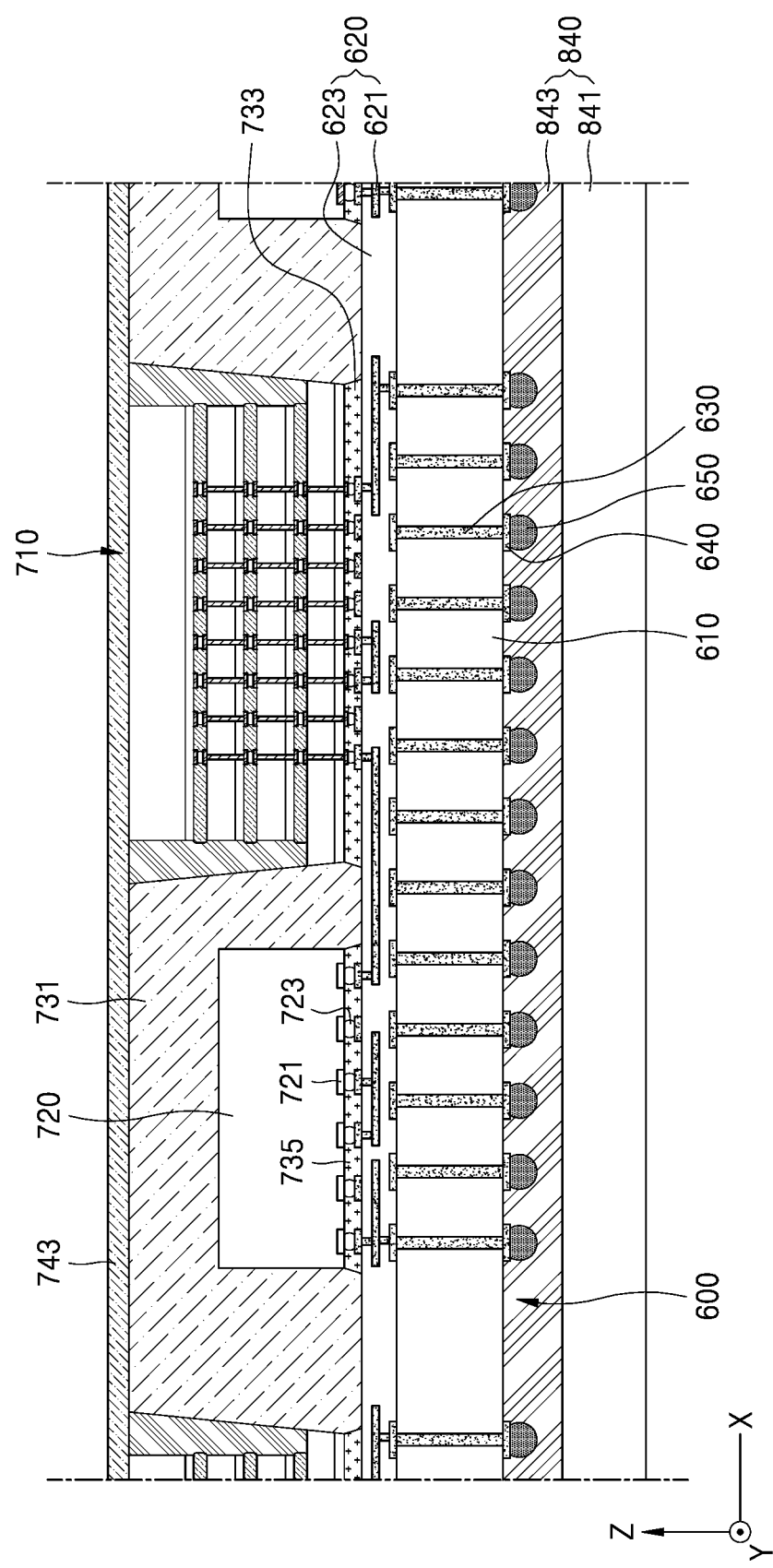
Figure 16C:
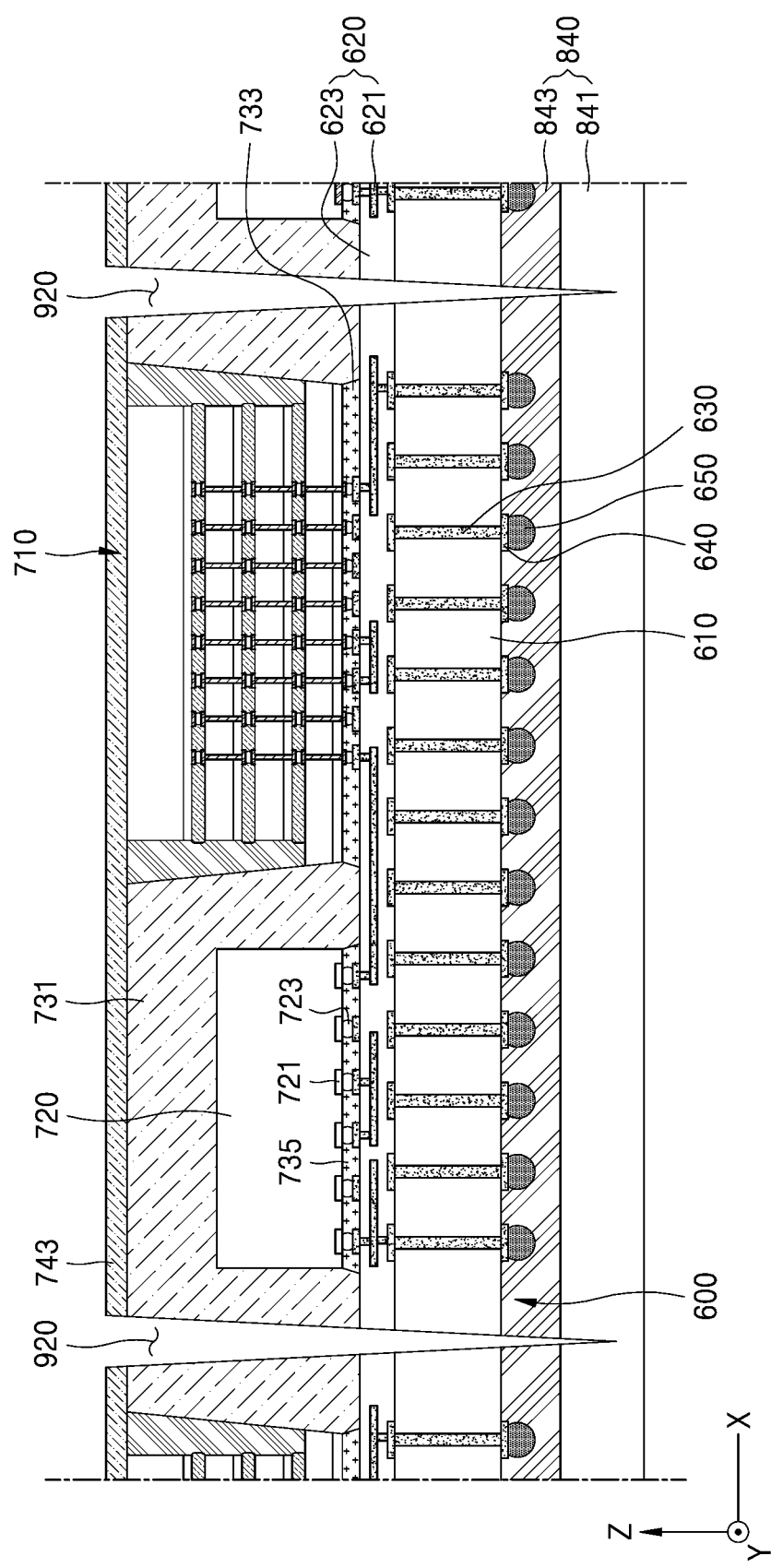

FIGS. 16A to 16C are cross-sectional views to describe a method of manufacturing a semiconductor package, according to example embodiments of the inventive concept. Hereinafter a method of manufacturing the semiconductor package 2000 shown in FIG. 15 will be described with reference to FIGS. 16A to 16C together with FIGS. 1A and 15.

Referring to FIG. 16A, the first semiconductor device 710 and the second semiconductor device 720 are mounted on the interposer 600 on a wafer level, which is attached to a carrier substrate 840. The carrier substrate 840 may include a support substrate 841 and an adhesive material 843 on the support substrate 841. For example, the first semiconductor device 710 may be mounted on the interposer 600 through the first connection bumps 160, and the second semiconductor device 720 may be mounted on the interposer 600 through the chip connection bumps 723.

Referring to FIG. 16B, after mounting the first semiconductor device 710 and the second semiconductor device 720 on the interposer 600, an underfill process may be performed to form the first underfill material layer 733 filling in a gap between the first semiconductor device 710 and the interposer 600 and the second underfill material layer 735 filling in a gap between the second semiconductor device 720 and the interposer 600. Thereafter, the package molding layer 731 covering a side surface of the first semiconductor device 710 and a side surface of the second semiconductor device 720 is formed on the interposer 600. The package molding layer 731 may include, for example an EMC. After forming the package molding layer 731, the TIM 743 may be formed on the upper surface of the first semiconductor device 710, the upper surface of the second semiconductor device 720, and an upper surface of the package molding layer 731.

Referring to FIG. 16C, a sawing process of cutting a result of FIG. 16B is performed. By the sawing process, the result of FIG. 16B may be divided into a plurality of structure bodies of a package size as shown in FIG. 15. After the sawing process, the carrier substrate 840 may be removed.

According to example embodiments of the inventive concept, the sawing process may include a laser cutting process and/or a blade cutting process.

According to example embodiments of the inventive concept, the sawing process may include the laser cutting process such that a surface cut by the sawing process has inclination. For example, a cut region 920 of a tapered shape as shown in FIG. 16C may be formed using the laser cutting process. By the laser cutting process, a side wall of the package molding layer 731 and/or a side wall of the interposer 600 may be formed to have inclination with respect to the vertical direction. For example, the side wall of the package molding layer 731 and/or the side wall of the interposer 600 may extend to be inclined at a certain angle with respect to the vertical direction orthogonal to the upper surface of the interposer 600 on which the first semiconductor device 710 is mounted, and may be on the same plane to have a continuous, flat surface.

Thereafter, as shown in FIG. 15, the interposer 600 is mounted on the package board 760, for example, after removing the carrier substrate 840 and adhesive material 843. The interposer 600 may be mounted on the package board 760 through the board-interposer interconnection terminals 650 The underfill material layer 750 encompassing the board-interposer interconnection terminals 650 may be formed between the interposer 600 and the package board 760. Thereafter, the heat-dissipating member 741 encompassing the first semiconductor device 710, the second semiconductor device 720, and the interposer 600 may be attached to the upper surface of the package board 760 and the TIM 743.

As discussed herein, a semiconductor package refers to one or more semiconductor chips stacked on a package substrate (which package substrate may be a package board, an interposer, or a semiconductor chip), and surrounded or encapsulated by a molding layer or molding member.

In general, an object to be cut, which is cut using a blade cutting manner, may have a non-uniform side wall or a non-uniform dimension due to wear or bending of a sawing blade, residues generated in a cut process using the sawing blade, and the like. Accordingly, to prevent the occurrence of unintended interference between semiconductor devices in a process of mounting the semiconductor devices on an interposer, it is typical to set a distance between the semiconductor devices to be large. For example, the distance between the semiconductor may be set greater than 100 μm. However, according to example embodiments of the inventive concept, because semiconductor devices may have a uniform side wall and a uniform dimension by being processed at a high precision through a laser cutting process, a distance between the semiconductor devices used to prevent interference between the semiconductor devices in the semiconductor package 2000 using the interposer therein may be reduced to a very low level. For example, the distance between the semiconductor devices may be reduced to less than 50 μm.

While the inventive concept has been particularly shown and described with reference to embodiments thereof, it will be understood that various changes in form and details may be made therein without departing from the spirit and scope of the following claims.

What is claimed is:

1. A semiconductor package comprising:
a first semiconductor chip comprising a first surface and a second surface opposite to each other;
at least a second semiconductor chip stacked on the first surface of the first semiconductor chip; and
a molding layer contacting the first surface of the first semiconductor chip and a side wall of the second semiconductor chip,
wherein the molding layer comprises a first external side wall, comprising:
a first external side wall portion extending from a lower end of the molding layer adjacent to the first semiconductor chip, to a first height to have a first slope from the lower end of the molding layer to the first height; and
a second external side wall portion extending from the first height to a second height to have a second slope from the first height to a second height, the second slope being different from the first slope, wherein the first and second slope are both relative to a horizontal direction parallel to the first surface of the first semiconductor chip,
wherein the first external side wall portion of the molding layer extends to be inclined
outward from the lower end of the molding layer to the first height, with respect to a vertical direction perpendicular to the horizontal direction, the first external side wall portion being inclined outward by making a cut from beyond a first horizontal surface of the molding layer; and
wherein the second external side wall portion of the molding layer extends to be inclined inward from the first height to the second height, with respect to a vertical direction perpendicular to the horizontal direction, the second external side wall portion being inclined inward by making a cut from beyond a second horizontal surface of the molding layer opposite the first horizontal surface.

2. The semiconductor package of claim 1, wherein the first semiconductor chip comprises first through electrodes, and
the second semiconductor chip comprises second through electrodes electrically connected to the first through electrodes.

3. The semiconductor package of claim 1, wherein the first external side wall of the molding layer further comprises a third external side wall portion extending with a third slope, which is different from the first slope and the second slope, from the second height to a third height.

4. The semiconductor package of claim 1, wherein the first semiconductor chip comprises a side wall having the same first slope as the first external side wall portion of the first external side wall of the molding layer.

5. The semiconductor package of claim 1, wherein a side wall of the first semiconductor chip comprises:
an upper part having the same first slope as the first external side wall portion of the first external side wall of the molding layer; and
a lower part having a slope different from the first slope.

6. The semiconductor package of claim 1, wherein a width of the molding layer in a direction that is parallel to the first surface of the first semiconductor chip has a maximum value at the first height at which the first external side wall portion and the second external side wall portion of the first external side wall of the molding layer meet.

7. A semiconductor package comprising:
a first semiconductor chip comprising a first surface, a second surface opposite to the first surface, and first through electrodes;
at least a second semiconductor chip stacked on the first surface of the first semiconductor chip and comprising second through electrodes electrically connected to the first through electrodes; and
a molding layer contacting the first surface of the first semiconductor chip and a side wall of the second semiconductor chip and comprising a first external side wall connected to and on the same plane as a side wall of the first semiconductor chip,
wherein the first external side wall of the molding layer extends to be inclined with respect to a first direction orthogonal to the first surface of the first semiconductor chip, and
both the first external side wall of the molding layer and the side wall of the first semiconductor chip have a first slope that is the same for both the first external side wall of the molding layer and the side wall of the first semiconductor chip,
wherein the molding layer further comprises a second external side wall extending from an upper end of the first external side wall to an upper surface of the molding layer, and the second external side wall of the molding layer has a second slope that is different from the first slope,
wherein the first external side wall of the molding layer extends to be inclined outward from a lower end thereof to an upper end thereof, with respect to the first direction, the first external side wall portion being inclined outward by making a cut from beyond a first horizontal surface of the molding layer, and
the second external side wall of the molding layer extends to be inclined inward from a lower end thereof to an upper end thereof, with respect to the first direction, the second external side wall portion being inclined inward by making a cut from beyond a second horizontal surface of the molding layer opposite the first horizontal surface.

8. The semiconductor package of claim 7, wherein a first angle of inclination made between the first external side wall of the molding layer and the first direction is about 0.5° to about 5°.

9. The semiconductor package of claim 7, wherein the side wall of the first semiconductor chip comprises:
an upper part having the first slope; and
a lower part having a slope that is different from the first slope.

10. A semiconductor package comprising:
a package board;
an interposer on the package board;
a first semiconductor device mounted on the interposer;
a second semiconductor device mounted on the interposer so as to be spaced apart horizontally from the first semiconductor device and electrically connected to the first semiconductor device through the interposer; and
a package molding layer provided on the interposer and covering a side wall of the first semiconductor device and a side wall of the second semiconductor device,
wherein the first semiconductor device comprises: a first semiconductor chip comprising a first surface and a second surface opposite to each other; at least one second semiconductor chip mounted on the first semiconductor chip; and a molding layer covering a side wall of the at least one second semiconductor chip, wherein the molding layer comprises a first side wall extending to be inclined with respect to a first direction orthogonal to the first surface of the first semiconductor chip, and wherein both the first side wall of the molding layer and a side wall of the first semiconductor chip have a first slope that is the same for both the first side wall of the molding layer and the side wall of the first semiconductor chip, wherein a side wall of the package molding layer is connected to a side wall of the interposer, and wherein at least one of the side wall of the package molding layer and the side wall of the interposer extends to be inclined with respect to the first direction.

11. The semiconductor package of claim 10, wherein a cross-section of the first semiconductor device cut along a plane parallel to the first direction has a trapezoidal shape or an inverted trapezoidal shape.

12. The semiconductor package of claim 10, wherein the first semiconductor device comprises:

a first side wall extending with the first slope from a lower end of the first semiconductor device to a first height; and a second side wall extending with a second slope that is different from the first slope from the first height to a second height.

\* \* \* \* \*